United States Patent
Kaneko et al.

(10) Patent No.: US 11,434,420 B2
(45) Date of Patent: Sep. 6, 2022

(54) COLOR CONVERSION COMPOSITION, COMPOUND USED FOR SAME, AND LIGHT EMITTING DEVICE

(71) Applicant: FUJIFILM Corporation, Tokyo (JP)

(72) Inventors: Kazuhei Kaneko, Kanagawa (JP); Yoshinori Kanazawa, Kanagawa (JP); Nobutaka Fukagawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 105 days.

(21) Appl. No.: 16/936,434

(22) Filed: Jul. 23, 2020

(65) Prior Publication Data

US 2020/0354629 A1 Nov. 12, 2020

Related U.S. Application Data

(63) Continuation of application No. PCT/JP2019/002457, filed on Jan. 25, 2019.

(30) Foreign Application Priority Data

Feb. 6, 2018 (JP) .............................. JP2018-018985

(51) Int. Cl.
*C09K 11/06* (2006.01)
*C07F 5/02* (2006.01)
*C09K 11/02* (2006.01)
*G02F 1/13357* (2006.01)

(52) U.S. Cl.
CPC .............. *C09K 11/06* (2013.01); *C07F 5/022* (2013.01); *C09K 11/02* (2013.01); *G02F 1/133617* (2013.01); *C09K 2211/1022* (2013.01)

(58) Field of Classification Search
CPC .. C09K 11/06; C09K 2211/1022; C07F 5/022
See application file for complete search history.

(56) References Cited

U.S. PATENT DOCUMENTS

| 2018/0134952 A1* | 5/2018 | Ichihashi | ................ C07F 5/022 |
| 2019/0086790 A1 | 3/2019 | Aotake et al. | |
| 2019/0270758 A1* | 9/2019 | Inouchi | .................. C09B 23/00 |

FOREIGN PATENT DOCUMENTS

| JP | 2012199541 | 10/2012 |
| JP | 5458301 | 4/2014 |
| JP | 2016006033 | 1/2016 |
| JP | 2018123093 | 8/2018 |
| WO | 2006058448 | 6/2006 |
| WO | 2013035303 | 3/2013 |
| WO | 2016190283 | 12/2016 |
| WO | 2017159610 | 9/2017 |
| WO | 2018079653 | 5/2018 |

OTHER PUBLICATIONS

Chen eet al, Sterically Protected N2O-Type Benzopyrromethene Boron Complexes from Boronic Acids with Intense Red/Near-Infrared Fluorescence, Organic Letters, vol. 19, pp. 2026-2029, Mar. 31, 2017.*
Sirbu et al, One-Pot Synthesis of a Mono-O,B,N-strapped BODIPY Derivative Displaying Bring Fluorescence in the Solid State, ORganic Letters, vol. 19, pp. 1626-1629, Mar. 20, 2017.*
English language translation of WO 2013/035303, p. 1-22, Apr. 4, 2022.*
Chusaku Ikeda et al., "Convenient and highly efficient synthesis of boron-dipyrrins bearing an arylboronate center", Tetrahedron Letters, Jul. 1, 2009, pp. 3349-3351.
Masaki Yamamura et al., "A facile and high-yield formation of dipyrrin-boronic acid dyads and triads: a light-harvesting system in the visible region based on the efficient energy transfer", Organic & Biomolecular Chemistry, Mar. 17, 2015, pp. 2574-2581.
"Search Report of Europe Counterpart Application", dated Oct. 30, 2020, p. 1-p. 8.
Mykola P. Shandura, et al., "(4,4-Difluoro-4-bora-3a, 4a,-diaza-s-indacen-3-yl) acetaldehyde: Synthesis and Chemical Properties." Journal of Heterocyclic Chemistry, vol. 46, Nov. 2009, pp. 1386-1391.
Mykola P. Shandura, et al., "3,5-Bis(acetaldehyde) substituted BODIPY.", Organic & Biomolecular Chemistry, vol. 11, Feb. 2013, pp. 835-841.
Yuriy V. Zatsikha, et al., "Functionalized bispyridoneannelated BODIPY—Bright long-wavelength fluorophores." Dyes and Pigments, vol. 114, Mar. 2015, pp. 215-221.
Tesuo Okujima, et al., "Synthesis of NIR-emitting O-chelated BODIPs fused with benzene and acenaphylene," Journal of Porphyrins and Phthalocyanines, vol. 18, Aug. 2014, pp. 752-761.
"International Search Report (Form PCT/ISA/210)"of PCT/JP2019/002457, dated Mar. 5, 2019, with English translation thereof, pp. 1-5.
"Written Opinion of the International Searching Authority (Form PCT/ISA/237)" of PCT/PCT/JP2019/002457, dated Mar. 5, 2019, with English translation thereof, pp. 1-7.

* cited by examiner

*Primary Examiner* — Alexander C Kollias
(74) *Attorney, Agent, or Firm* — JCIPRNET

(57) ABSTRACT

Provided are a color conversion composition which contains at least one kind of compound represented by a specific general formula, a compound which is used in the color conversion composition and represented by a specific general formula, and a light emitting device which has a color conversion portion consisting of the color conversion composition and a light source.

13 Claims, No Drawings

COLOR CONVERSION COMPOSITION, COMPOUND USED FOR SAME, AND LIGHT EMITTING DEVICE

CROSS-REFERENCE TO RELATED APPLICATIONS

This application is a Continuation of PCT International Application No. PCT/JP2019/002457 filed on Jan. 25, 2019, which claims priority under 35 U.S.C. § 119 (a) to Japanese Patent Application No. 2018-018985 filed in Japan on Feb. 6, 2018. Each of the above applications is hereby expressly incorporated by reference, in its entirety, into the present application.

BACKGROUND OF THE INVENTION

1. Field of the Invention

The present invention relates to a color conversion composition, a compound used for the same, and a light emitting device.

2. Description of the Related Art

In recent years, the development of devices using optoelectronics, photoelectronics, and the like has made rapid progress. For example, light emitting elements such as an organic light emitting diode (OLED) and an inorganic light emitting diode, solar cells, and color conversion elements have been commercialized. With the development of these devices and the expansion of the scope of application thereof, the research and development of materials used for these devices, for example, fluorescent compounds or compositions containing fluorescent compounds, are being actively conducted.

For example, WO2013/035303A describes, as a material used for an organic thin-film solar cell, an organic thin-film solar cell material containing a specific compound in which a dipyrromethene compound is coordinated to a coordination metal atom in a tetradentate manner. WO2016/190283A discloses a color conversion composition containing a dipyrromethene boron complex compound, in which a dipyrromethene compound is coordinated to a boron atom in a bidentate manner, and a binder resin.

In display devices such as various displays, a light emitting diode emitting white light is widely used. In recent years, there has been a growing interest in the issue of energy saving, and, accordingly, lighting devices such as fluorescent lamps using a white LED have rapidly become widespread.

Usually, a white LED is constituted with a combination of an LED and a phosphor. Generally, this phosphor is formed of a color conversion composition containing a fluorescent compound (also referred to as photoluminescent phosphor), which has a function or property of absorbing light (incoming ray) of a specific wavelength radiated from an LED and emitting light (outgoing ray) of a specific wavelength different from the incoming ray, and a resin used as needed. Among fluorescent compounds, an organic fluorescent compound exhibits high color conversion efficiency and is thus superior to an inorganic fluorescent compound. Examples of such an organic fluorescent compound include the dipyrromethene boron complex compound in WO2016/190283A described above. However, WO2013/035303A has no description regarding the use of the aforementioned compound as a phosphor of an LED.

SUMMARY OF THE INVENTION

With the spread of light emitting devices such as display devices and lighting devices, fluorescent compounds and color conversion compositions containing the fluorescent compounds used in these devices are required to have not only a high quantum yield but also high light fastness, high durability against moisture and heat (moisture-heat resistance), and the like.

In the present invention, the quantum yield refers to the ratio of the number of photons that a fluorescent compound emits as fluorescence to the number of photons absorbed by the fluorescent compound.

An object of the present invention is to provide a color conversion composition (also referred to as a color conversion material) which achieves both the high level of light fastness and high level of moisture-heat resistance while maintaining a high quantum yield. Another object of the present invention is to provide a fluorescent compound used in the color conversion composition exhibiting the excellent characteristics described above. Still another object of the present invention is to provide a light emitting device using the color conversion composition exhibiting the excellent characteristics described above.

The inventors of the present invention have found that a specific compound represented by the following general formula, in which a compound obtained by introducing one or two specific substituents into a dipyrromethene skeleton is coordinated to a boron atom as a tridentate or tetradentate ligand, and a composition containing the specific compound function as a fluorescent compound or a color conversion composition respectively, have a high quantum yield, and exhibit excellent characteristics in terms of light fastness and moisture-heat resistance. Based on these findings, the inventors further repeated examinations and have accomplished the present invention.

That is, the objects of the present invention have been achieved by the following means.

<1> A color conversion composition containing at least one kind of compound between a compound represented by General Formula (I) and a compound represented by General Formula (II).

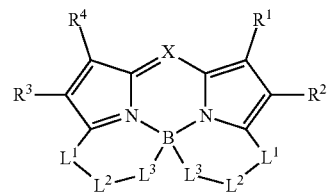

General Formula (I)

General Formula (II)

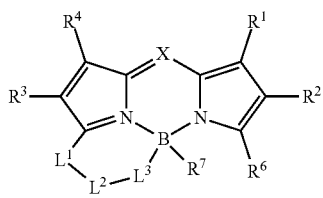

In the general formulas, X represents $CR^5$ or N.

$R^1$ to $R^6$ represent a hydrogen atom, an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, a halogen atom, a cyano group, a formyl group, an R—CO— group, an R—O—CO— group, an R—CO—O— group, an $(R^4)_2$N—CO— group, an amino group, a nitro group, or a silyl group. R represents an alkyl group, a cycloalkyl group, an aliphatic heterocyclic group, an alkenyl group, a cycloalkenyl group, an alkynyl group, an aryl group, or a heteroaryl group. $R^4$ represents a hydrogen atom, an alkyl group, a cycloalkyl group, an aliphatic heterocyclic group, an alkenyl group, a cycloalkenyl group, an alkynyl group, an aryl group, or a heteroaryl group.

$R^7$ represents an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, or a halogen atom. Here, $R^6$ and $R^7$ are not bonded to each other to form a ring.

$L^1$ represents a linking group selected from an arylene group, a heteroarylene group, an ethenylene group, an alkylene group, and a cycloalkylene group.

$L^2$ represents a single bond, a carbonyl group, or an alkylene group which forms a ring structure together with $L^1$ and $L^3$ and has 1 to 6 carbon atoms. Here, in a case where $L^3$ is a linking group represented by Formula (1-1), $L^2$ represents a carbonyl group or an alkylene group having 1 to 6 carbon atoms.

$L^3$ represents a linking group represented by any of Formulas (1-1) to (1-3).

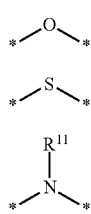

Formula (1-1)

Formula (1-2)

Formula (1-3)

In Formula (1-3), $R^{11}$ represents a hydrogen atom or a substituent.

* represents a portion bonded to a boron atom or $L^2$ in General Formula (I) or General Formula (II).

<2> The color conversion composition described in <1>, in which all of $L^3$s represent the linking group represented by Formula (1-1).

<3> The color conversion composition described in any one of <1> or <2>, in which X represents $CR^5$, and $R^5$ is an aryl group.

<4> The color conversion composition described in any one of claims 1 to 3, in which all of $L^2$s represent an alkylene group which forms a ring structure together with $L^1$ and $L^3$ and has 1 carbon atom.

<5> The color conversion composition described in any one of <1> to <4>, in which all of ring structures formed of adjacent carbon and nitrogen atoms in a pyrrole ring, a boron atom, and $L^1$ to $L^3$ in the compounds represented by the general formulas are 6-membered or 7-membered ring structures.

<6> The color conversion composition described in any one of <1> to <5>, further containing a resin.

<7> The color conversion composition described in <6>, in which the resin is polystyrene, a (meth)acrylic resin, a silicone resin, or a mixture of two or more kinds of these.

<8> The color conversion composition described in any one of <1> to <7>, in which a content of the compound in the color conversion composition is 0.1 to 0.5 μmol/g.

<9> A compound represented by General Formula (I).

General Formula (I)

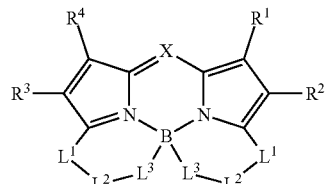

In the general formula, X represents $CR^5$ or N.

$R^1$ to $R^5$ represent a hydrogen atom, an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, a halogen atom, a cyano group, a formyl group, an R—CO— group, an R—O—CO— group, an R—CO—O— group, an $(R^4)_2$N—CO— group, an amino group, a nitro group, or a silyl group. R represents an alkyl group, a cycloalkyl group, an aliphatic heterocyclic group, an alkenyl group, a cycloalkenyl group, an alkynyl group, an aryl group, or a heteroaryl group. $R^4$ represents a hydrogen atom, an alkyl group, a cycloalkyl group, an aliphatic heterocyclic group, an alkenyl group, a cycloalkenyl group, an alkynyl group, an aryl group, or a heteroaryl group.

$L^1$ represents a linking group selected from an arylene group, a heteroarylene group, an ethenylene group, an alkylene group, and a cycloalkylene group.

$L^2$ represents a single bond, a carbonyl group, or an alkylene group which forms a ring structure together with $L^1$ and $L^3$ and has 1 to 6 carbon atoms. Here, in a case where $L^3$ is a linking group represented by Formula (1-1), $L^2$ represents a carbonyl group or an alkylene group having 1 to 6 carbon atoms.

$L^3$ represents a linking group represented by any of Formulas (1-1) to (1-3).

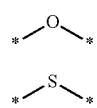

Formula (1-1)

Formula (1-2)

Formula (1-3)

In Formula (1-3), $R^{11}$ represents a hydrogen atom or a substituent.

\* represents a portion bonded to a boron atom or $L^2$ in General Formula (I).

<10> A compound represented by General Formula (II).

General Formula (II)

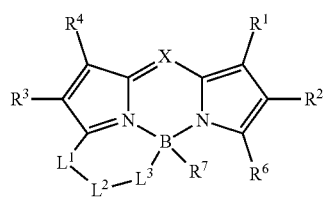

In the general formula, X represents $CR^5$ or N.

$R^1$ to $R^6$ represent a hydrogen atom, an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, a halogen atom, a cyano group, a formyl group, an R—CO— group, an R—O—CO— group, an R—CO—O— group, an $(R^4)_2$N—CO— group, an amino group, a nitro group, or a silyl group. R represents an alkyl group, a cycloalkyl group, an aliphatic heterocyclic group, an alkenyl group, a cycloalkenyl group, an alkynyl group, an aryl group, or a heteroaryl group. $R^4$ represents a hydrogen atom, an alkyl group, a cycloalkyl group, an aliphatic heterocyclic group, an alkenyl group, a cycloalkenyl group, an alkynyl group, an aryl group, or a heteroaryl group.

$R^7$ represents an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, or a halogen atom. Here, $R^6$ and $R^7$ are not bonded to each other to form a ring.

$L^1$ represents a linking group selected from an arylene group, a heteroarylene group, an ethenylene group, an alkylene group, and a cycloalkylene group.

$L^2$ represents a single bond, a carbonyl group, or an alkylene group which forms a ring structure together with $L^1$ and $L^3$ and has 1 to 6 carbon atoms. Here, in a case where $L^3$ is a linking group represented by Formula (1-1), $L^2$ represents a carbonyl group or an alkylene group having 1 to 6 carbon atoms.

$L^3$ represents a linking group represented by any of Formulas (1-1) to (1-3).

Formula (1-1)

Formula (1-2)

Formula (1-3)

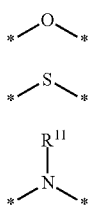

In Formula (1-3), $R^{11}$ represents a hydrogen atom or a substituent.

\* represents a portion bonded to a boron atom or $L^2$ in General Formula (II).

<11> A light emitting device, including a light source and a color conversion portion which converts light emitted from the light source and consists of the color conversion composition described in any one of <1> to <8>.

<12> The light emitting device described in <11>, which is a display device or a lighting device.

<13> The light emitting device described in <12>, in which the display device is a liquid crystal display device.

In the present invention, "color conversion" means converting (incoming) light of a specific wavelength into (outgoing) light of a wavelength different from the specific wavelength, usually, a wavelength longer than the specific wavelength. "Color conversion" is also referred to as "wavelength conversion".

The color conversion composition according to an embodiment of the present invention and the compound according to an embodiment of the present invention exhibit a high quantum yield and can achieve both the high level of light fastness and high level of moisture-heat resistance. Therefore, the composition and the compound can be suitably used, for example, in light emitting devices such as display devices and lighting devices. Furthermore, the light emitting device according to an embodiment of the present invention has a high quantum yield, excellent light fastness, and excellent moisture-heat resistance. Therefore, the light emitting device can emit outgoing rays, which are obtained by the color conversion of incoming rays, for a long period of time with a high quantum yield.

The above and other features and advantages of the present invention will be further clarified by the following description.

DESCRIPTION OF THE PREFERRED EMBODIMENTS

In the present specification, in a case where there is a plurality of substituents, linking groups, and the like (hereinafter, described as substituents and the like) marked with specific reference signs or formulas, or in a case where a plurality of substituents and the like are simultaneously specified, unless otherwise specified, the substituents and the like may be the same as or different from each other. The same is true of a case where the number of substituents and the like is specified. Furthermore, in a case where a plurality of substituents and the like are close (particularly, adjacent) to each other, unless otherwise specified, the substituents and the like may be linked to each other to form a ring. In addition, unless otherwise specified, a ring such as an alicyclic ring, an aromatic ring, or a heterocyclic ring may be further fused to form a fused ring.

In the present specification, in a case where a molecule has an E-type double bond and a Z-type double bond, unless otherwise specified, the molecule may be either an E isomer or a Z isomer or may be a mixture thereof.

In the present invention, the term "compound" (including a complex) means a compound including a salt and ion thereof. Furthermore, as long as the effects of the present invention are not impaired, the term also means a compound having partially modified structure. In addition, for a compound which is not specified regarding whether or not the compound is substituted, as long as the effects of the present invention are not impaired, the term means that the compound may have any substituent. The same is true of substituents and linking groups.

Furthermore, in the present invention, a range of numerical values described using "to" means a range including numerical values described before and after "to" as a lower limit and an upper limit.

In the present invention, a composition includes a mixture of components having a constant concentration (evenly dispersed components) and a mixture of components having a concentration that changes within a range in which the intended color conversion function is not impaired.

[Color Conversion Composition]

The color conversion composition according to the embodiment of the present invention contains, as a phosphor, at least one kind of compound between a compound represented by General Formula (I) which will be described later and a compound represented by General Formula (II) which will be described later (either or both of the compounds are referred to as compound according to the embodiment of the present invention in some cases). The color conversion composition converts the wavelength of the incoming ray into a longer wavelength. Specifically, the composition can convert the incoming ray into light of a wavelength equal to or longer than 540 nm, for example. The color conversion composition according to the embodiment of the present invention may contain one kind of phosphor or two or more kinds of phosphors, but at least one kind of phosphor in the composition is a compound represented by General Formula (I) which will be described later or a compound represented by General Formula (II) which will be described later.

The compound according to the embodiment of the present invention functions as a phosphor, and can convert the wavelength of the incoming ray into a longer wavelength. Therefore, the compound is also referred to as color conversion substance. The incoming ray, which comes into the compound according to the embodiment of the present invention in a case where the compound functions as a phosphor, and the light of a longer wavelength converted from the incoming ray are the same as those described above regarding the color conversion composition.

<Compound Represented by General Formula (I)>

The compound that can be contained in the color conversion composition according to the embodiment of the present invention is a fluorescent compound represented by General Formula (I) (hereinafter, referred to as compound (I) in some cases).

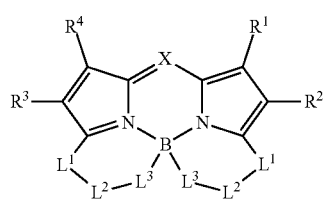

General Formula (I)

In General Formula (I), X represents $CR^5$ or N, and preferably represents $CR^5$.

$R^1$ to $R^5$ each independently represent a hydrogen atom, an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, a halogen atom, a cyano group, a formyl group, an R—CO— group, an R—O—CO— group, an R—CO—O— group, an $(R^4)_2$N—CO— group, an amino group, a nitro group, or a silyl group. R represents an alkyl group, a cycloalkyl group, an aliphatic heterocyclic group, an alkenyl group, a cycloalkenyl group, an alkynyl group, an aryl group, or a heteroaryl group. $R^4$ represents a hydrogen atom, an alkyl group, a cycloalkyl group, an aliphatic heterocyclic group, an alkenyl group, a cycloalkenyl group, an alkynyl group, an aryl group, or a heteroaryl group.

The alkyl group, the cycloalkyl group, the aliphatic heterocyclic group, the alkenyl group, the cycloalkenyl group, the alkynyl group, the alkoxy group, the alkylthio group, the aryloxy group, the arylthio group, the aryl group, the heteroaryl group, the amino group, and the silyl group that can be adopted as $R^1$ to $R^5$ have the same definition as the corresponding groups in a substituent group T respectively, and preferred examples thereof are also the same. Specific examples of each of these groups include those described in WO2016/190283A, and the descriptions of the examples are preferably incorporated into the present specification. As described in the substituent group T, each of the alkynyl group, the alkoxy group, and the alkylthio group includes a cyclic group in addition to linear and branched groups.

Examples of the halogen atom include a fluorine atom, a chlorine atom, a bromine atom, and an iodine atom. Among these, a fluorine atom is preferable.

The groups which can be adopted as R in the R—CO— group, the R—O—CO— group, and the R—CO—O— group capable of being adopted as $R^1$ to $R^5$ have the same definition as the corresponding groups that can be adopted as $R^1$ to $R^5$ respectively, and preferred ranges thereof are also the same. R is preferably an alkyl group, an aryl group, or a heteroaryl group.

The groups which can be adopted as R in the $(R^4)_2$N—CO— group capable of being adopted as $R^1$ to $R^5$ have the same definition as the corresponding groups that can be adopted as $R^1$ to $R^5$, and the preferred ranges thereof are also the same. $R^4$ is preferably a hydrogen atom, an alkyl group, a cycloalkyl group, an aryl group, or a heteroaryl group.

Each of the above groups that can be adopted as $R^1$ to $R^5$ may be an unsubstituted group or a group having a substituent. The substituent that may be included in the above groups capable of being adopted as $R^1$ to $R^5$ is not particularly limited. It is preferable that the substituent is selected from the substituent group T which will be described later. As the substituent that may be included in the groups capable of being adopted as $R^1$ to $R^4$ and particularly as $R^2$ and $R^3$, an alkyl group, an alkoxy group, an aryl group, a heteroaryl group, or a silyl group is preferable. As the substituent that may be included in the groups capable of being adopted as $R^5$, a cyano group or a halogen atom is particularly preferable. As long as the above groups have one or more substituents, the number of substituents is not particularly limited. For example, the number of substituents can be equal to or smaller than 4.

Each of $R^1$ and $R^4$ preferably represents a hydrogen atom, an alkyl group, an aryl group, or a heteroaryl group, more preferably represents a hydrogen atom or an alkyl group, and even more preferably represents a hydrogen atom.

Each of $R^2$ and $R^3$ preferably represents a hydrogen atom, an alkyl group, an alkynyl group, an aryl group, or a heteroaryl group, and more preferably represents a hydrogen atom, an alkynyl group, or an aryl group.

In a case where $CR^5$ is adopted as X, $R^5$ is preferably a hydrogen atom, an alkyl group, an aryl group, a heteroaryl group, a cyano group, or an R—O—CO— group, more preferably an alkyl group, an aryl group, or a heteroaryl group, and even more preferably an aryl group.

$R^1$ to $R^4$ may be the same as or different from each other. It is preferable that at least $R^1$ and $R^4$ represent a hydrogen atom. It is more preferable that both of $R^1$ and $R^4$ represent a hydrogen atom. $R^1$ to $R^4$ may be the same as $R^5$. However, it is preferable that $R^1$ to $R^4$ are different from $R^5$. In this case, it is preferable that at least $R^1$ and $R^4$ represent a hydrogen atom and $R^5$ represents an aryl group which is more preferably a phenyl group.

$L^1$ each independently represents a divalent linking group which is selected from an arylene group, a heteroarylene group, an ethenylene group, an alkylene group, and a cycloalkylene group.

Each of the arylene group, the heteroarylene group, the alkylene group, and the cycloalkylene group that can be adopted as $L^1$ has the same definition as a group obtained in a case where one more hydrogen atom is removed from the aryl group, the heteroaryl group, the alkyl group, and the cycloalkyl group that can be adopted as $R^1$ to $R^4$, and the preferred examples thereof are also the same.

$L^1$ is preferably an arylene group or a heteroarylene group, more preferably an arylene group, even more preferably an unsubstituted arylene group, and particularly preferably a phenylene group.

In each of the above groups that can be adopted as $L^1$, the portion bonded to a carbon atom and $L^2$, which will be described later, in the pyrrole ring in General Formula (I) is not particularly limited, and is preferably two adjacent atoms (vicinal atoms) in each of the above groups. For example, in a case where a phenylene group is adopted as $L^1$, a 1,2-phenylene group is preferable.

$L^2$ each independently represents a single bond, a carbonyl group, or an alkylene group having 1 to 6 carbon atoms. Here, in a case where $L^3$ is a linking group represented by Formula (1-1) which will be described later, $L^2$ represents a carbonyl group or an alkylene group having 1 to 6 carbon atoms, and preferably represents an alkylene group having 1 to 6 carbon atoms.

The number of carbon atoms in the alkylene group that can be adopted as $L^2$ does not mean the total number of carbon atoms constituting the alkylene group, and means the number of carbon atoms incorporated into the ring structure formed of adjacent carbon atoms (carbon atoms bonded to $L^1$) and a nitrogen atom in a pyrrole ring, a boron atom, and $L^1$ to $L^3$ in General Formula (I). In the present invention, the number of carbon atoms in the alkylene group as 12 is also referred to as "number of carbon atoms forming a ring structure together with $L^1$ and $L^3$". For example, in the case of a 2,2-propylidene group, the carbon atoms (methyl group) at both ends do not form a ring structure together with $L^1$ and $L^3$. Accordingly, the number of carbon atoms forming a ring structure together with $L^1$ and $L^3$ is 1. The number of carbon atoms in the alkylene group that can be adopted as $L^2$ is preferably 1 or 2, and more preferably 1. On the other hand, the total number of carbon atoms in $L^2$ is preferably 1 to 46, more preferably from 1 to 13, even more preferably from 1 to 7, and particularly preferably from 1 to 3.

As the alkylene group having 1 carbon atom, a group represented by —C($R^{21}$)($R^{22}$)— is preferable. Herein, each of $R^{21}$ and $R^{22}$ has the same definition as $R^1$. Each of $R^{21}$ and $R^{22}$ is preferably a hydrogen atom, an alkyl group, a cycloalkyl group, an aliphatic heterocyclic group, an aryl group, or a heteroaryl group, more preferably an alkyl group, and even more preferably a methyl group. $R^{21}$ and $R^{22}$ may be the same as or different from each other. $R^{21}$ and $R^{22}$ preferably both represent an alkyl group, and more preferably both represent a methyl group.

Each of the above groups that can be adopted as $R^{21}$ and $R^{22}$ may be an unsubstituted group or a group having a substituent. The substituent which may be included in each of the above groups capable of being adopted as $R^{21}$ and $R^{22}$ is not particularly limited. It is preferable that the substituent is selected from the substituent group T which will be described later. The number of substituents is not particularly limited as long as it is equal to or greater than 1.

In the present invention, in a case where there is a plurality of groups and the like represented by the same reference sign in a general formula, these groups and the like can each independently adopt a preferred range specified in the present invention. One of the preferred embodiments of the present invention is an embodiment in which a plurality of groups and the like represented by the same reference sign all adopt a preferred range specified in the present invention.

Regardless of $L^3$, $L^2$ is preferably an alkylene group having 1 to 6 carbon atoms, more preferably an alkylene group having 1 or 2 carbon atoms, even more preferably an alkylene group having 1 carbon atom, and particularly preferably a 2,2-propylidene group.

In the present invention, in a case where -$L^1$-$L^2$- in General Formula (I) is an alkylene group having 2 or more carbon atoms, $L^2$ is an alkylene group having 1 carbon atom that forms a ring structure together with $L^1$ and $L^3$, and $L^1$ is the rest of the alkylene portion.

$L^3$ represents a divalent linking group which is represented by any of Formulas (1-1) to (1-3). Among these, a linking group represented by Formula (1-1) is preferable.

In Formula (1-3), $R^{11}$ represents a hydrogen atom or a substituent. The substituent that can be adopted as $R^{11}$ is not particularly limited, and is preferably selected from the substituent group T which will be described later. As $R^{11}$, a hydrogen atom, an alkyl group, an aryl group, a heteroaryl group, and a sulfonyl group are preferable.

In each formula, * represents a portion bonded to a boron atom or $L^2$ in General Formula (I) or General Formula (II).

Each of the groups or linking groups that can be adopted as $L^1$ to $L^3$ may be unsubstituted or may have a substituent. The substituent which may be included in each of the groups or linking groups capable of being adopted as $L^1$ to $L^3$ is not particularly limited, but is preferably selected from the substituent group T which will be described later. The number of substituents is not particularly limited as long as it is equal to or greater than 1.

In the compound represented by General Formula (I), two ring structures formed of adjacent carbon and nitrogen atoms in a pyrrole ring, a boron atom, and $L^1$ to $L^3$ are not particularly limited as long as $L^1$ to $L^3$ specified in the present invention are satisfied.

The number of members constituting each of the ring structures can be, for example, 6 to 9, and is preferably 6 or 7.

In each of the ring structures, the combination of $L^1$ to $L^3$ is not particularly limited. It is preferable to combine preferred groups or linking groups that can be adopted as $L^1$ to $L^3$. For example, as a combination of any two groups among $L^1$ to $L^3$ (a combination of $L^1$ and $L^2$, a combination of $L^1$ and $L^3$, and a combination of $L^2$ and $L^3$) or a combination of $L^1$ to $L^3$ (a combination of $L^1$, $L^2$, and $L^3$), the following groups or linking groups may be combined.

$L^1$ is an arylene group and preferably a 1,2-phenylene group.

$L^2$ is an alkylene group which forms a ring structure together with $L^1$ and $L^3$ and has 1 carbon atom, and preferably a 2,2-propylidene group.

$L^3$ is a linking group represented by Formula (1-1).

In the compound (I) represented by General Formula (I), the two ring structures present in a molecule may be the same as or different from each other, and are preferably the same as each other.

<Compound Represented by General Formula (II)>

The compound that can be contained in the color conversion composition according to the embodiment of the present invention is a fluorescent compound represented by General Formula (II) (hereinafter, referred to as compound (II) in some cases).

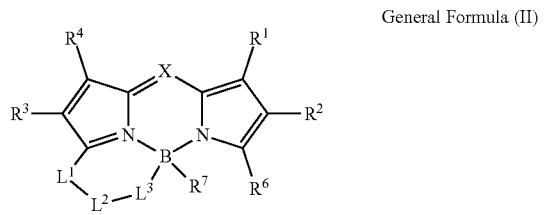

General Formula (II)

The compound represented by General Formula (II) is the same as the compound (I) described above, except that the compound represented by General Formula (II) has one ring structure formed of adjacent carbon and nitrogen atoms in a pyrrole ring, a boron atom, and $L^1$ to $L^3$.

Therefore, in General Formula (II), X, $R^1$ to $R^5$, and $L^1$ to $L^3$ have the same definition as X, $R^1$ to $R^5$, and $L^1$ to $L^3$ in General Formula (I) respectively, and preferred examples thereof are also the same.

In General Formula (II), $R^6$ has the same definition as $R^1$ in General Formula (I). Here. $R^6$ is preferably a hydrogen atom, an alkyl group, an aryl group, a halogen atom, or a heteroaryl group.

$R^7$ represents an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, or a halogen atom. These groups or atoms that can be adopted as $R^7$ have the same definition as the corresponding groups or atoms that can be adopted as $R^1$, and preferred examples thereof are also the same. Here, $R^7$ is preferably a halogen atom, an alkynyl group, an alkoxy group, or a hydroxyl group.

Each of the above groups that can be adopted as $R^6$ and $R^7$ may be an unsubstituted group or a group having a substituent. The substituent which may be included in each of the above groups capable of being adopted as $R^6$ and $R^7$ is not particularly limited. It is preferable that the substituent is selected from the substituent group T which will be described later. The number of substituents is not particularly limited as long as it is equal to or greater than 1.

$R^6$ and $R^7$ are not bonded to each other directly or through a linking group to form a ring. This ring is a ring formed of adjacent carbon and nitrogen atoms in a pyrrole ring, a boron atom, and $L^1$ to $L^3$ in the compound represented by General Formula (I). A ring may be formed in the compound represented by General Formula (II) as long as it is not the aforementioned ring.

—Substituent Group T—

In the present invention, as substituents, for example, substituents selected from the following substituent group T are preferable.

Furthermore, in the present specification, in a case where only the term "substituent" is mentioned, the substituent group T may be referred to. In a case where a substituent is described as each group such as an alkyl group, the corresponding group in the substituent group T may be applied.

In addition, in the present specification, in a case where an alkyl group is specially described as a cyclic (cyclo) alkyl group, "alkyl group" means both the linear alkyl group and branched alkyl group. On the other hand, unless an alkyl group is specially described as cyclic alkyl group and unless otherwise specified, "alkyl group" means all of a linear alkyl group, a branched alkyl group, and a cycloalkyl group. The same is true of the groups (an alkoxy group, an alkylthio group, an alkenyloxy group, and the like) including groups (an alkyl group, an alkenyl group, an alkynyl group, and the like) that can have a cyclic structure and the compounds including groups that can have a cyclic structure. In a case where a group can form a cyclic skeleton, the lower limit of the number of atoms in the group forming the cyclic skeleton is equal to or greater than 3 and preferably equal to or greater than 5, regardless of the lower limit of the number of atoms specifically described below regarding the group that can have such a structure.

In the following description of the substituent group T, for example, just as "alkyl group" and "cycloalkyl group", a group having a linear or branched structure and a group having a cyclic structure are separately described in some cases such that they are clearly distinguished from each other.

The groups included in the substituent group T include the following groups.

For example, the substituent group T includes an alkyl group (preferably having 1 to 20 carbon atoms, more preferably having 1 to 12 carbon atoms, even more preferably having 1 to 8 carbon atoms, and particularly preferably having 1 to 6 carbon atoms), an alkenyl group (preferably having 2 to 20 carbon atoms, and more preferably having 2 to 12 carbon atoms), an alkynyl group (preferably having 2 to 20 carbon atoms, and more preferably having 2 to 12 carbon atoms), a cycloalkyl group (preferably having 3 to 20 carbon atoms), a cycloalkenyl group (preferably having 5 to 20 carbon atoms), an aryl group (the aryl group may be a monocyclic group or a fused cyclic group (preferably a fused cyclic group having 2 to 6 rings); the number of members constituting the monocyclic ring is preferably 5 to 7 and more preferably 5 or 6; the aryl group preferably has 6 to 40 carbon atoms, more preferably has 6 to 30 carbon atoms, even more preferably has 6 to 26 carbon atoms, and particularly preferably has 6 to 10 carbon atoms), a heterocyclic group (the heterocyclic group has at least one nitrogen atom, oxygen atom, sulfur atom, a phosphorus atom, a silicon atom, or a selenium atom as a hetero atom constituting the ring; the heterocyclic group may be a monocyclic group or a fused cyclic group (preferably a fused cyclic group having 2 to 6 rings; the number of members constituting the monocyclic ring is preferably 5 to 7 and more preferably 5 or 6; the heterocyclic group preferably has 2 to 40 carbon atoms and more preferably has 2 to 20 carbon atoms; the heterocyclic group includes an aromatic heterocyclic group (heteroaryl group) and an aliphatic heterocyclic group (aliphatic heterocyclic group), an alkoxy group (preferably having 1 to 20 carbon atoms, and more preferably having 1 to 12 carbon atoms), an alkenyloxy group (preferably having 2 to 20 carbon atoms, and more preferably having 2 to 12 carbon atoms), and an alkynyloxy group (preferably having 2 to 20 carbon atoms, and more preferably having 2 to 12 carbon atoms), a cycloalkyloxy group (preferably having 3 to 20 carbon atoms), an aryloxy group (preferably having 6 to 40 carbon atoms, more preferably having 6 to 26 carbon atoms, and even more preferably having 6 to 14 carbon atoms), a heterocyclic oxy group (preferably having 2 to 20 carbon atoms).

an alkoxycarbonyl group (preferably having 2 to 20 carbon atoms), a cycloalkoxycarbonyl group (preferably having 4 to 20 carbon atoms), an aryloxycarbonyl group (preferably having 6 to 20 carbon atoms), an amino group (preferably having 0 to 20 carbon atoms; the amino group includes an unsubstituted amino group (—NH$_2$), a (mono- or di-) alkylamino group, a (mono- or di-) alkenylamino group, a (mono- or di-) alkynylamino group, a (mono- or di-) cycloalkylamino group, a (mono- or di-) cycloalkenylamino group, a (mono- or di-) arylamino group, and a (mono- or di-) heterocyclic amino group; each of the above groups substituting the unsubstituted amino group has the same definition as the corresponding group in the substituent group T), a sulfamoyl group (preferably having 0 to 20 carbon atoms; the sulfamoyl group is preferably an alkyl, cycloalkyl, or aryl sulfamoyl group), an acyl group (preferably having 1 to 20 carbon atoms, and more preferably having 2 to 15 carbon atoms), an acyloxy group (preferably having 1 to 20 carbon atoms), a carbamoyl group (preferably having 1 to 20 carbon atoms; the carbamoyl group is preferably an alkyl, cycloalkyl, or aryl carbamoyl group);

an acylamino group (preferably having 1 to 20 carbon atoms), a sulfonamide group (preferably having 0 to 20 carbon atoms; the sulfonamide group is preferably an alkyl, cycloalkyl, or aryl sulfonamide group), an alkylthio group (preferably having 1 to 20 carbon atoms, and more preferably having 1 to 12 carbon atoms), a cycloalkylthio group (preferably having 3 to 20 carbon atoms), an arylthio group (preferably having 6 to 40 carbon atoms, more preferably having 6 to 26 carbon atoms, and even more preferably having 6 to 14 carbon atoms), a heterocyclic thio group (preferably having 2 to 20 carbon atoms), an alkyl, cycloalkyl, or aryl sulfonyl group (preferably having 1 to 20 carbon atoms).

a silyl group (preferably having 1 to 30 carbon atoms, and more preferably having 1 to 20 carbon atoms; the silyl group is preferably a silyl group substituted with alkyl, aryl, alkoxy, or aryloxy), a silyloxy group (preferably having 1 to 20 carbon atoms; the silyloxy group is preferably a silyloxy group substituted with alkyl, aryl, alkoxy, or aryloxy), a hydroxy group, a cyano group, a nitro group, a halogen atom (for example, a fluorine atom, a chlorine atom, a bromine atom, or an iodine atom), a phosphoryl group (—O—PO(OH)$_2$), a boric acid group, a hydroxy group, or a mercapto group.

The substituent selected from the substituent group T is more preferably an alkyl group, an alkenyl group, a cycloalkyl group, an aryl group, a heterocyclic group, an alkoxy group, a cycloalkoxy group, an aryloxy group, an alkoxycarbonyl group, a cycloalkoxycarbonyl group, an amino group, an acylamino group, a cyano group, or a halogen atom, and particularly preferably an alkyl group, an alkenyl group, an aryl group, a heterocyclic group, an alkoxy group, an alkoxycarbonyl group, an amino group, an acylamino group, or a cyano group.

Unless otherwise specified, the substituent selected from the substituent group T also includes a group obtained by combining a plurality of groups described above. For example, in a case where a compound or a substituent and the like include an alkenyl group or the like, these may be substituted or unsubstituted. Furthermore, in a case where a compound or a substituent and the like include an aryl group, a heterocyclic group, or the like, these may be a monocyclic ring or a fused ring which may be substituted or unsubstituted.

Specific examples of the compound represented by General Formula (I) and the compound represented by General Formula (II) will be shown below and in Examples, but the present invention is not limited to these compounds. In the following specific examples, TMS represents a trimethylsilyl group.

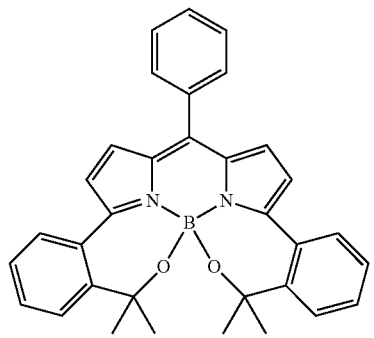

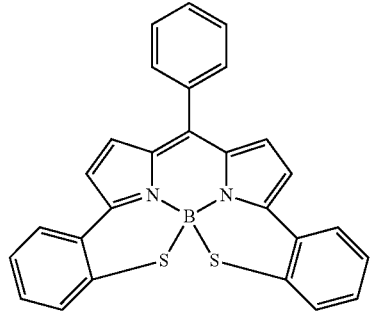

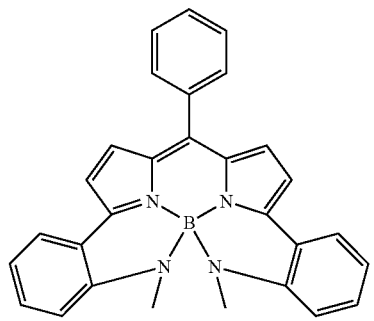

-continued
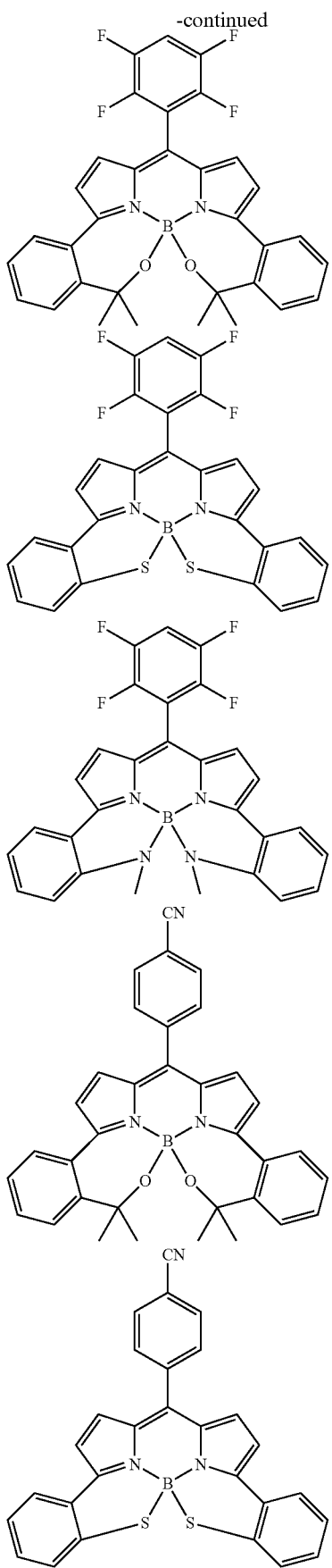
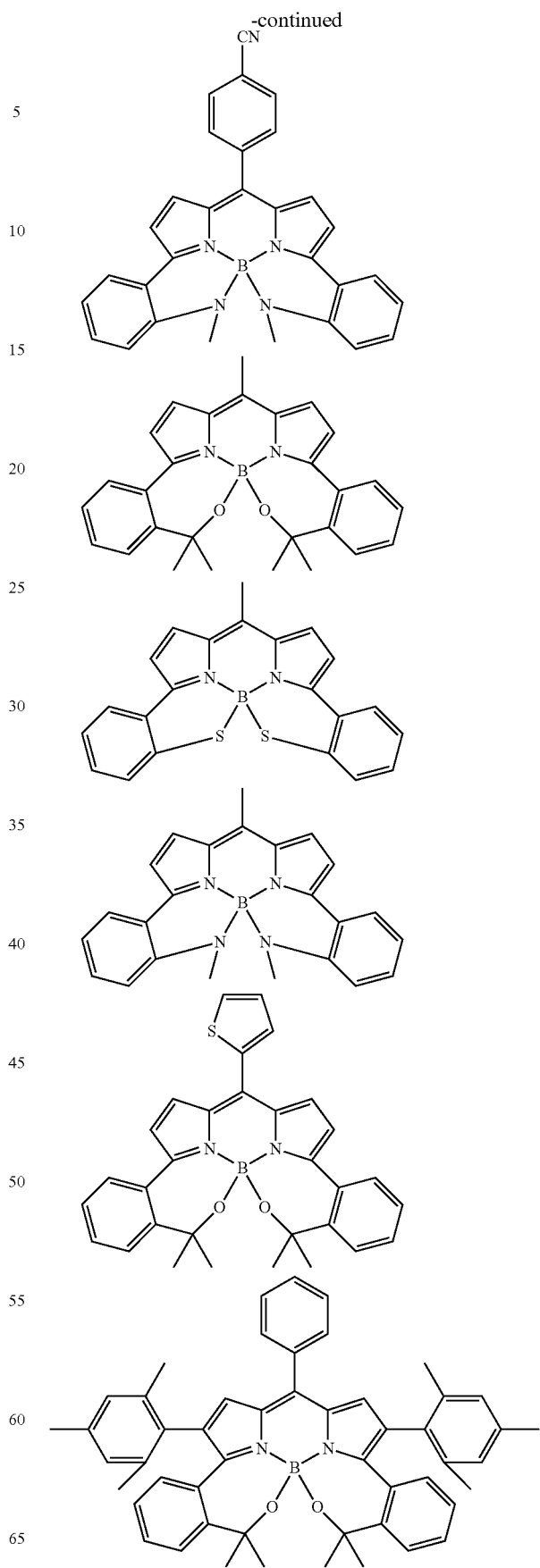

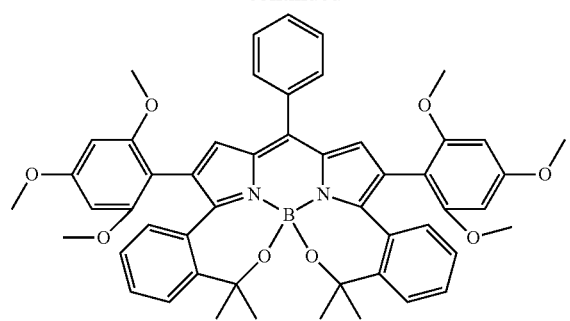
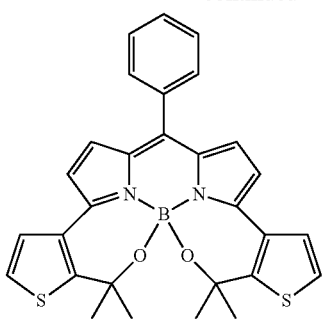
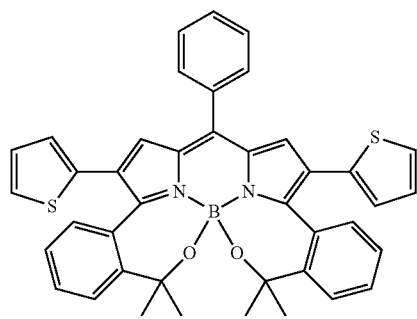
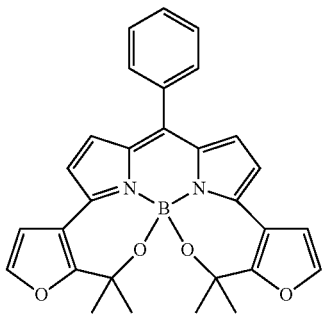
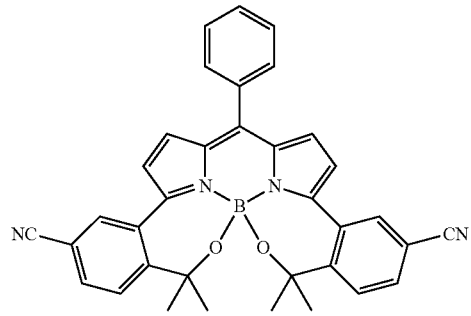
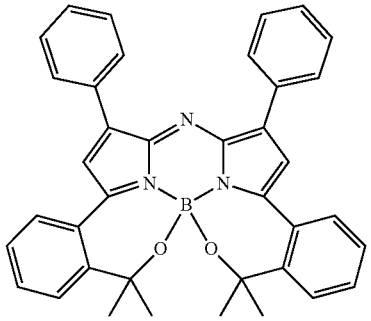
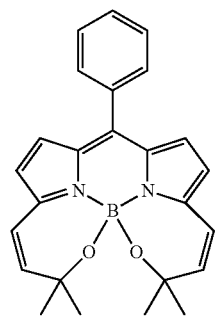
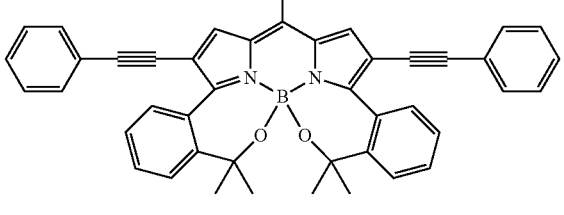
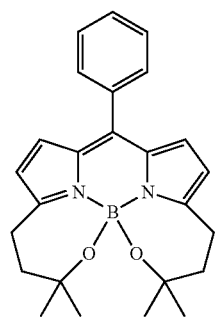
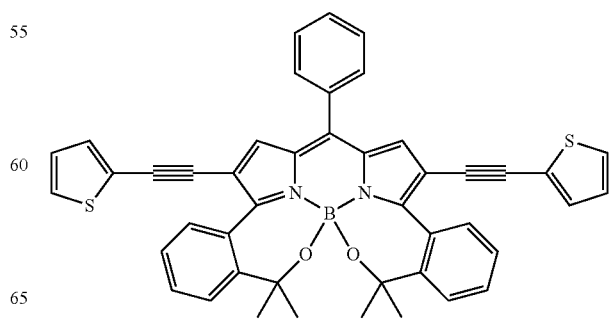

-continued
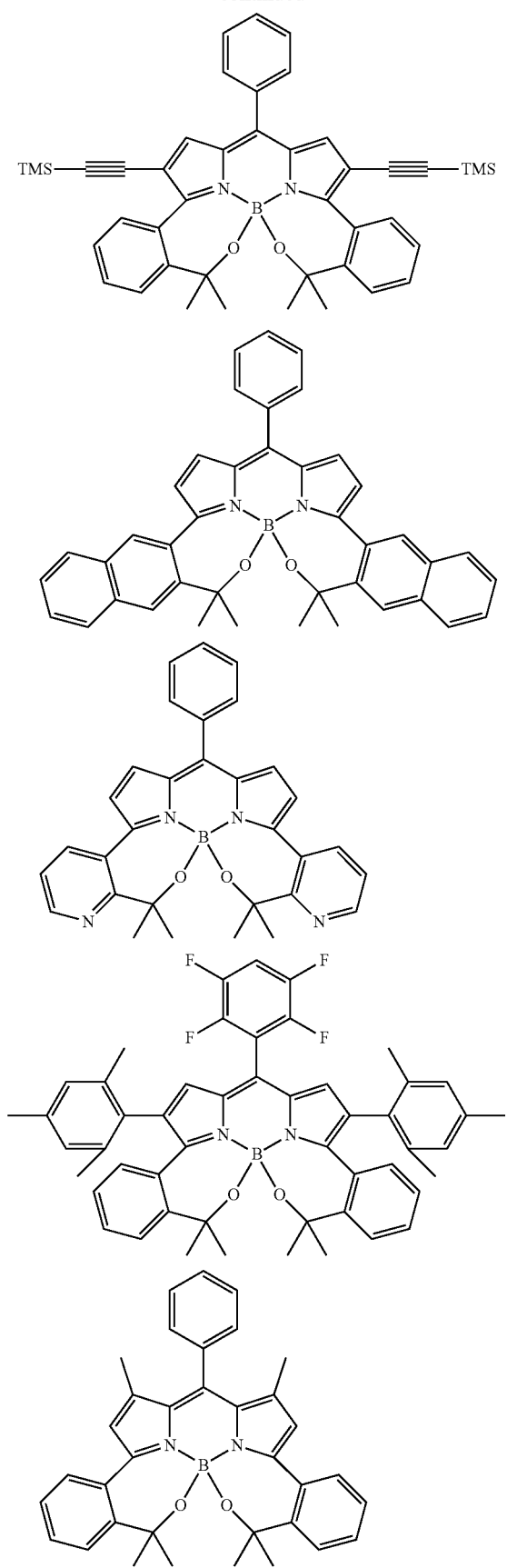
-continued
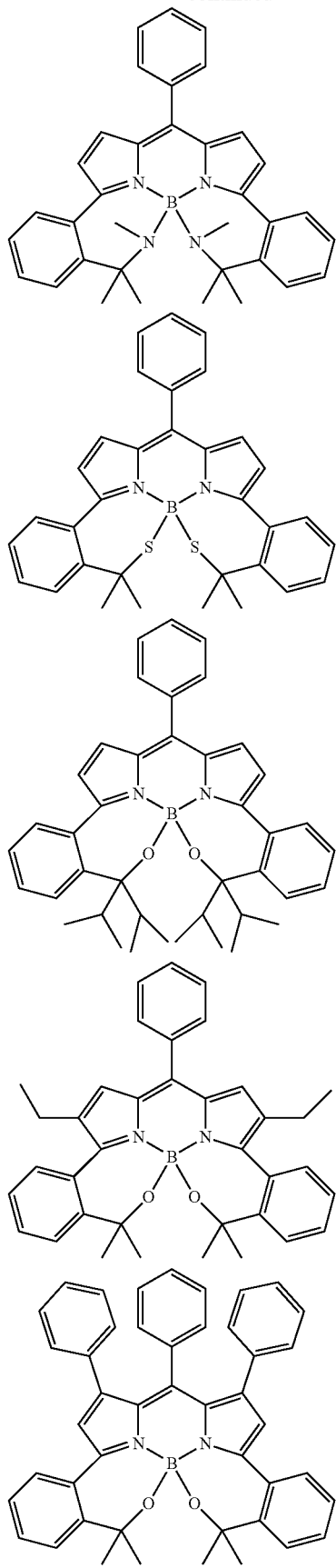

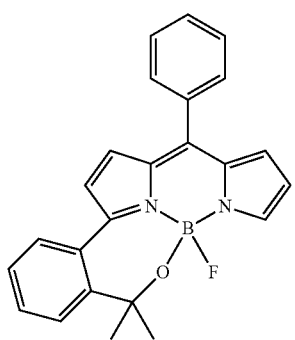
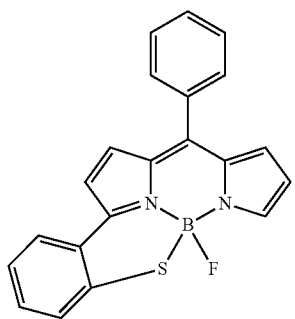
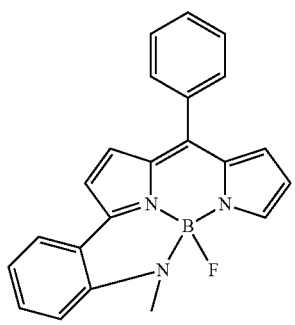
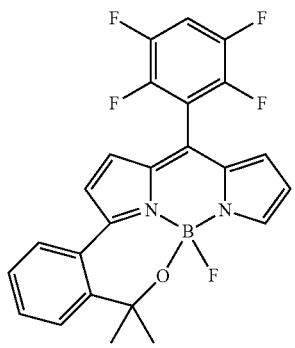
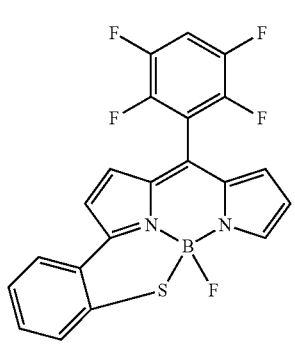
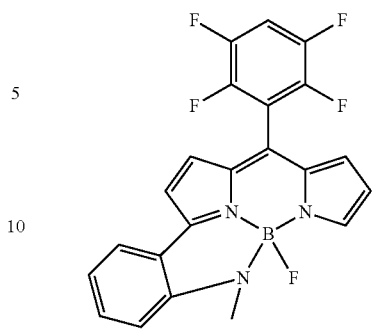
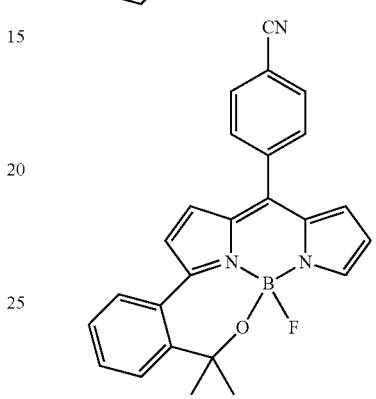
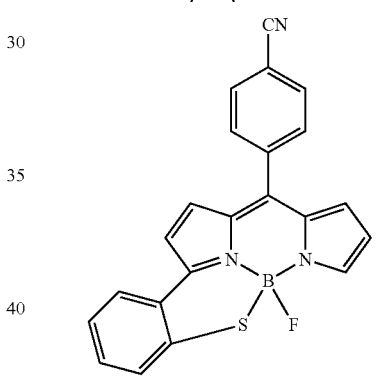
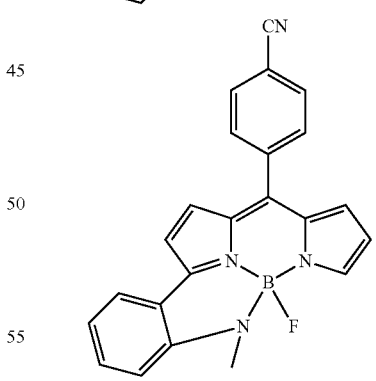
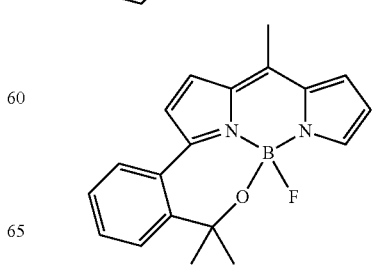

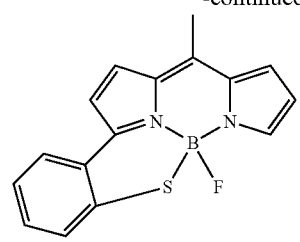
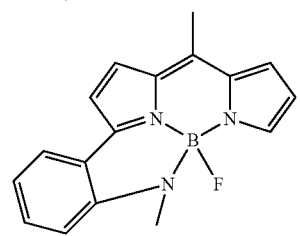
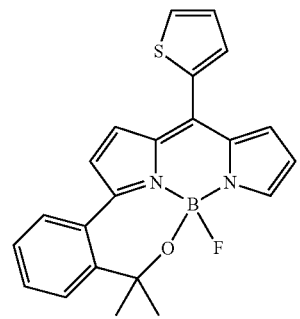
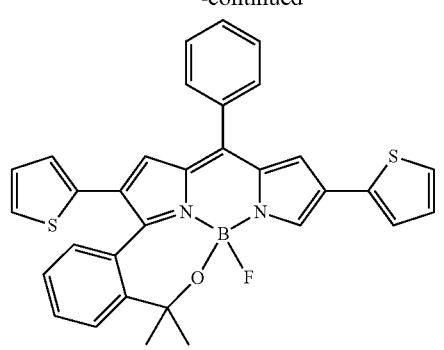
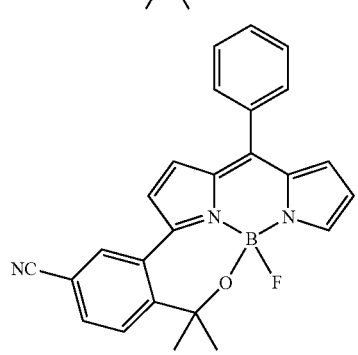
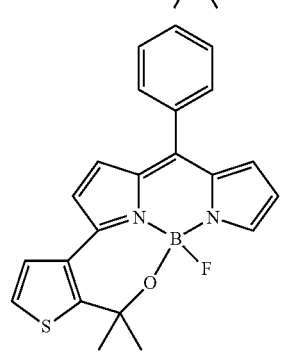
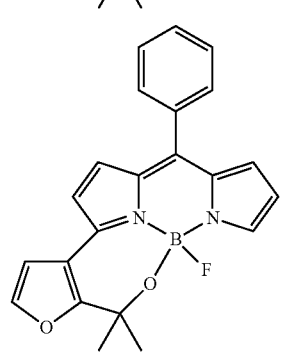
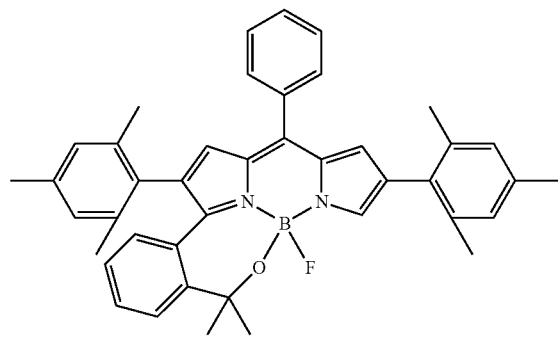
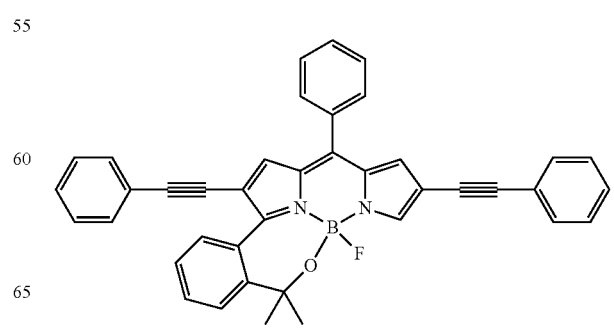
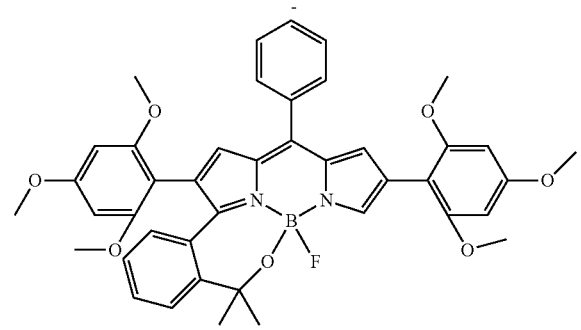

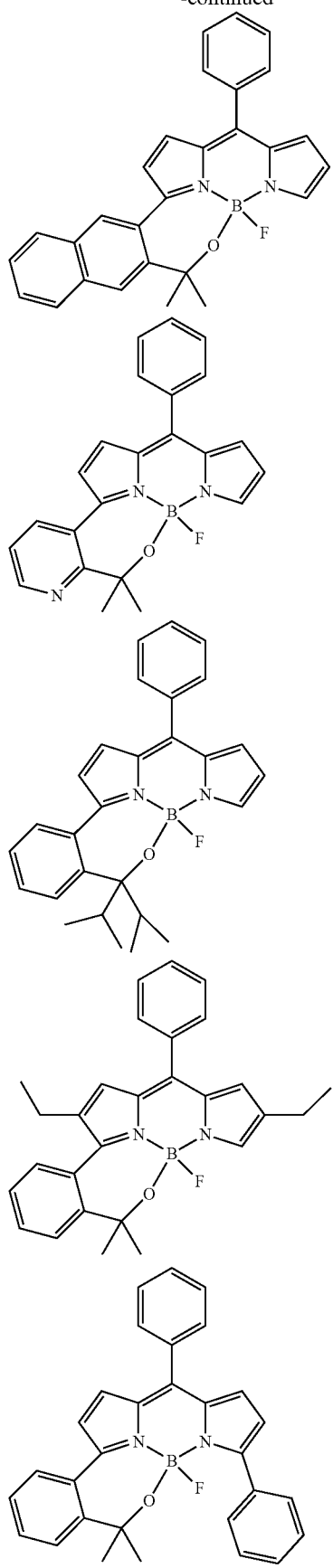
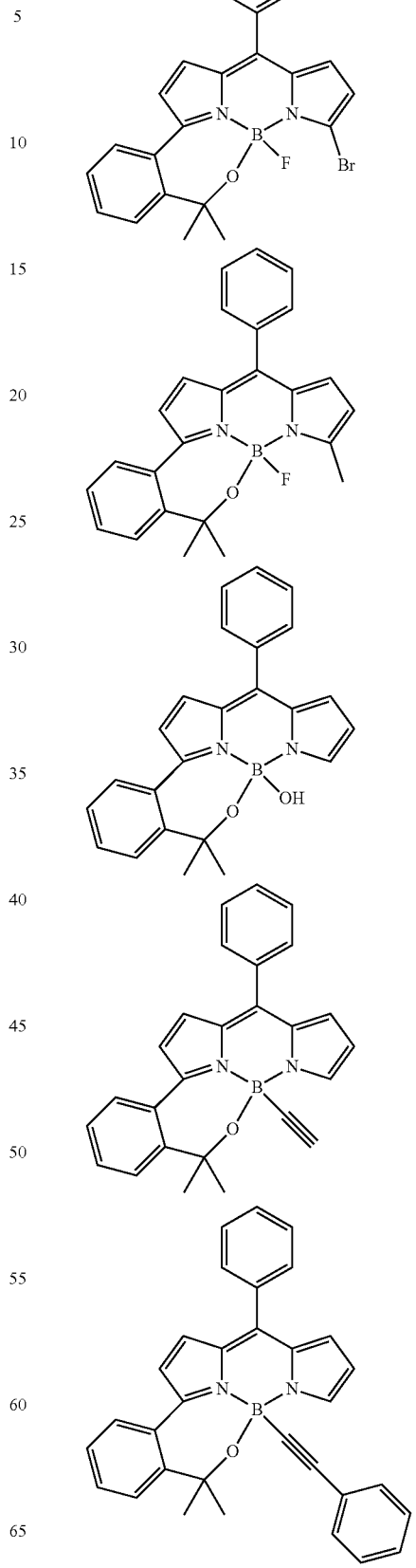

27
-continued
28
-continued
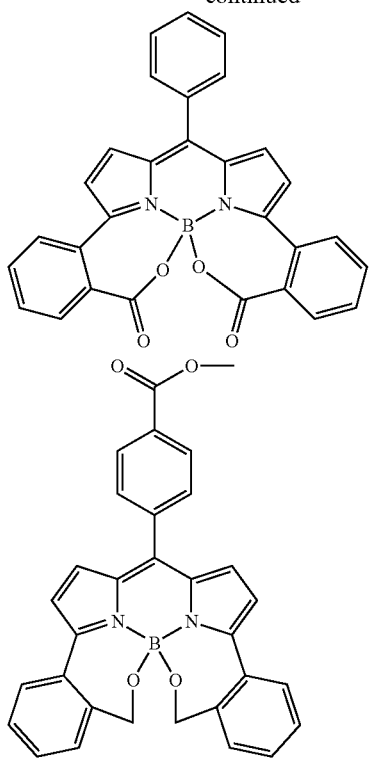
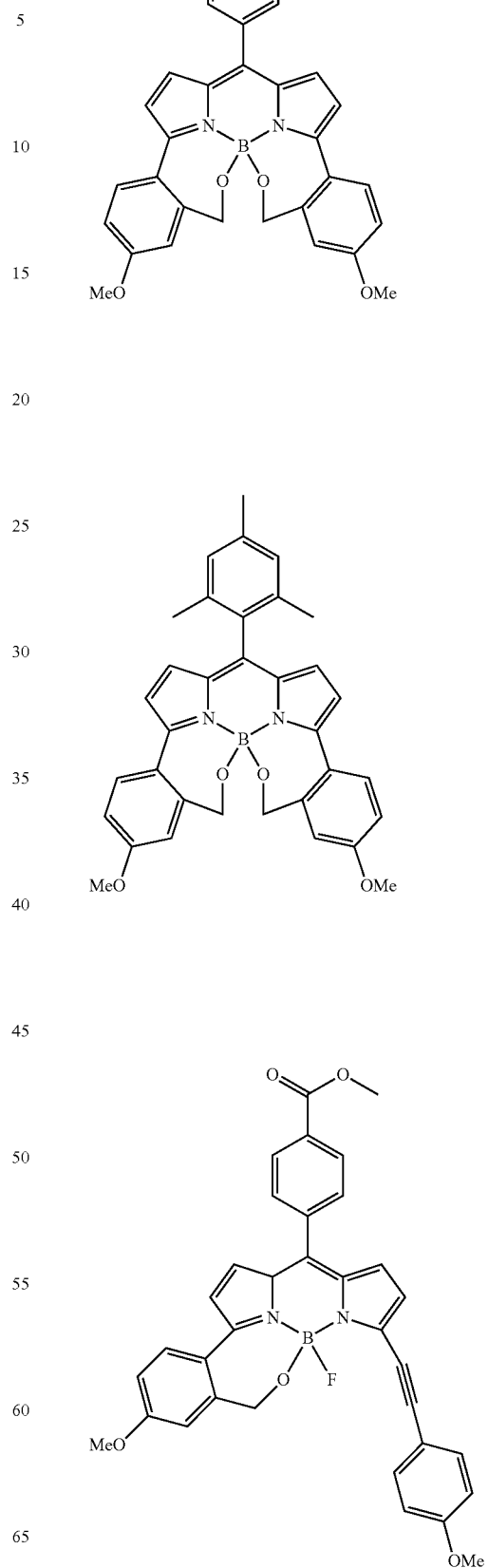

-continued

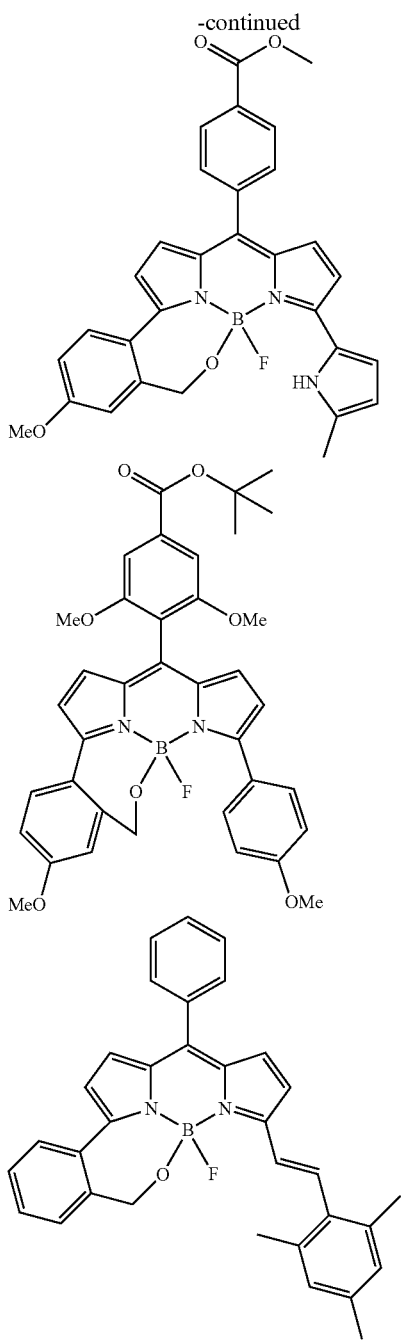

The color conversion composition according to the embodiment of the present invention may contain one kind of compound represented by General Formula (I) and one kind of compound represented by General Formula (II) or may contain two or more kinds of compounds represented by General Formula (I) and two or more kinds of compounds represented by General Formula (II). In addition, the color conversion composition according to the embodiment of the present invention may contain either or both of the compound represented by General Formula (I) and the compound represented by General Formula (II), as long as the composition contains at least one kind of compound between the compound represented by General Formula (I) and the compound represented by General Formula (II). In view of the quantum yield, the light fastness, and the moisture-heat resistance, it is preferable that the color conversion composition according to the embodiment of the present invention contains at least the compound represented by General Formula (I).

In the color conversion composition according to the embodiment of the present invention, the content (content per 1 g of solid contents) of the compound represented by General Formula (I) and the compound represented by General Formula (II) is not particularly limited, and is appropriately determined according to the molar extinction coefficient of the compound and the required characteristics (quantum yield, light fastness, moisture-heat resistance, and the like). For example, the content is preferably equal to or smaller than 0.01 to 50 μmol/g, more preferably equal to or smaller than 0.05 to 10 μmol/g, even more preferably 0.1 to 1.0 μmol/g, and most preferably 0.1 to 0.5 μmol/g.

In the color conversion composition according to the embodiment of the present invention, the content of the compound represented by General Formula (I) and the compound represented by General Formula (II) is not particularly limited as long as the content satisfies the aforementioned content per 1 g of solid contents. For example, the content of the compounds represented by General Formula (I) and General Formula (II) with respect to 100 parts by mass of the resin, which will be described later, is preferably 0.0005 to 5 parts by mass, preferably equal to or smaller than 0.0025 to 1 part by mass, and even more preferably 0.005 to 0.1 parts by mass.

In a case where the color conversion composition according to the embodiment of the present invention contains two or more kinds of compounds represented by General Formula (I) or General Formula (II), the aforementioned content means the total content of the compounds.

The compound represented by General Formula (I) and the compound represented by General Formula (II) can be synthesized with reference to conventional synthesis methods or known synthesis methods such as the synthesis methods described in WO2013/035303A and WO2016/190283A. Furthermore, these compounds can be synthesized according to the synthesis methods of compounds (1) to (12) described in Examples which will be described later.

<Resin>

The color conversion composition according to the embodiment of the present invention may contain a resin as a binder (also referred to as a binder resin). Particularly, in a case where the color conversion composition forms a color conversion member which will be described later, the composition generally contains a binder resin.

In the present invention, as the binder resin, it is possible to use a thermoplastic polymer compound, a thermosetting or photocurable polymer compound, or a mixture of these. In the present invention, in a case where a polymer compound is a thermosetting or photocurable polymer compound, "polymer compound" also includes a compound (monomer) or a polymeric precursor that forms the polymer compound.

In a case where the color conversion composition according to the embodiment of the present invention takes a form other than particles (non-particle form), the binder resin is not used in the form of particles.

The binder resin used in the present invention is preferably transparent or semitransparent (having a transmittance equal to or higher than 50% for visible rays (wavelength: 300 to 830 nm)).

Examples of such a binder resin include a (meth)acrylic resin, polyvinyl cinnamate, polycarbonate, polyimide, polyamide imide, polyester imide, polyether imide, polyether ketone, polyether ether ketone, polyether sulfone, polysulfone, polyparaxylene, polyester, polyvinyl acetal, polyvinyl chloride, polyvinyl acetate, polyamide, polystyrene, polyurethane, polyvinyl alcohol, cellulose acylate, a fluorinated resin, a silicone resin, an epoxy silicone resin, a phenol resin, an alkyd resin, an epoxy resin, a maleic acid resin, a melamine resin, a urea resin, aromatic sulfonamide, a benzoguanamine resin, a silicone elastomer, aliphatic polyolefin (for example, ethylene or polypropylene), a cyclic olefin copolymer, and the like.

As the binder resin, polystyrene, a (meth)acrylic resin, a silicone resin, or a mixture of two or more kinds of these is preferable.

The mass average molecular weight of the binder resin is not particularly limited, but is preferably, for example, 1.000 to 100,000.

The color conversion composition according to the embodiment of the present invention may contain one kind of binder resin or two or more kinds of binder resins.

The content of the binder resin in the color conversion composition is not particularly limited. For example, the content of the binder resin can be equal to or greater than 50% by mass, and is preferably equal to or greater than 90% by mass.

<Solvent>

The color conversion composition according to the embodiment of the present invention may be a liquid composition containing a solvent. The solvent to be used is not particularly limited, and examples thereof include the solvents described regarding the method for preparing the color conversion composition that will be described later.

The content of the solvent in the color conversion composition is not particularly limited. For example, the content of the solvent can be equal to or greater than 70% by mass, and is preferably equal to or greater than 90% by mass and more preferably equal to or greater than 99% by mass.

<Additives>

The color conversion composition according to the embodiment of the present invention may contain various additives that are usually used in color conversion compositions. Examples of such additives include photoluminescent phosphors other than the compound according to the embodiment of the present invention, inorganic phosphors, dyes for tone correction, processing, oxidation, and heat stabilizers (such as antioxidants and phosphorus-based processing stabilizers), light fastness stabilizers (such as ultraviolet absorbers), silane coupling agents, organic acids, matting agents, radical scavengers, deterioration inhibitors, fillers (for example, silica, glass fibers, and glass beads), plasticizers, lubricants, flame retardants (for example, organic halogen compounds), flame retardant aids, antistatic agents, charbeability imparting agents, impact resistance enhancers, discoloration inhibitors, release agents (for example, higher fatty acid esters of monohydric or polyhydric alcohols), fluidity enhancers, reactive or non-reactive diluents, and the like.

The photoluminescent phosphors other than the compound according to the embodiment of the present invention are not particularly limited, and examples thereof include known photoluminescent phosphors (coloring agents). Specific examples of the various additives include "other components" described in WO2016-190283A, those described in JP2011-241160A, and the like. The descriptions of the additives are preferably incorporated into the present specification. The content of the additives is not particularly limited, and is appropriately determined within a range that does not impair the objects of the present invention.

The color conversion composition according to the embodiment of the present invention may be a solution composition obtained by dissolving the compound according to the embodiment of the present invention and, as components used if necessary, a binder resin and additives in a solvent, or a solid composition which is a mixture of the compound according to the embodiment of the present invention and, as components used if necessary, a binder resin and additives.

Both the compound according to the embodiment of the present invention and the color conversion composition according to the embodiment of the present invention can convert the incoming ray into light of a wavelength longer than the wavelength of the incoming ray, and exhibit a high quantum yield, excellent light fastness, and excellent moisture-heat resistance. The quantum yield exhibited by the compound according to the embodiment of the present invention and the color conversion composition according to the embodiment of the present invention is the same as the quantum yield exhibited by a color conversion portion used in the light emitting device according to an embodiment of the present invention. Particularly preferably, the compound according to the embodiment of the present invention and the color conversion composition according to the embodiment of the present invention can be used as a color conversion material for a white LED. In this case, the compound and the composition can still maintain a high quantum yield, excellent light fastness, and excellent moisture-heat resistance.

The details about why the compound according to the embodiment of the present invention and the color conversion composition according to the embodiment of the present invention exhibit a high quantum yield, excellent light fastness, and excellent moisture-heat resistance have not yet been revealed, but are considered as follows.

As shown in each of the general formulas, all of the compounds according to the embodiment of the present invention are obtained by coordinating a compound having a dipyrromethene skeleton, into which one or two specific substituents (for example, a hydroxymethylphenyl group, a mercaptophenyl group, and an aminophenyl group) having an acid dissociation constant (pKa) higher than a pKa of a phenolic hydroxyl group are introduced, to a boron atom not as a bidentate ligand but as a tridentate or tetradentate ligand. It is considered that for this reason, the bond with the boron atom in the compound (complex) may become strong, and thus the compound and the composition including the compound may exhibit a high quantum yield, excellent light fastness, and excellent moisture-heat resistance.

Particularly, in a case where the steric hindrance around the boron atom increases due to the formed ring structure including $L^1$ to $L^3$, for example, by adopting a group causing a big steric hindrance as $L^2$, the quantum yield and the moisture-heat resistance can be improved. The reason is still unclear but is assumed to be as follows. That is, in a case where the steric hindrance around the boron atom increases, the nucleophilic attack from water can be more effectively reduced, and accordingly, it is possible to impart high moisture-heat resistance and to maintain a high quantum yield by inhibiting the aggregation of the compound according to the embodiment of the present invention (in both the resin and the solution).

<Method for Preparing Color Conversion Composition>

The method for preparing the color conversion composition according to the embodiment of the present invention is not particularly limited, and examples thereof include the following methods A to C.

Method A: a method including a step of dissolving or suspending the compound according to the embodiment of the present invention and, as components used if necessary, a binder resin and additives in a solvent as needed.

In this method A, the solution obtained by the above step can be dried.

Method B: a method including a step of curing a mixture including the compound according to the embodiment of the present invention and, as components used if necessary, a monomer and/or polymeric precursor forming a binder resin, and additives.

For example, a method may be used in which the compound according to the embodiment of the present invention and, as components used if necessary, additives are mixed with (dispersed in) a monomer or a polymeric precursor of a thermosetting or photocurable polymer, and then the monomer or the polymeric precursor are polymerized. Furthermore, for example, a method may be used in which the compound according to the embodiment of the present invention and, as components used if necessary, additives are mixed with (dissolved or suspended in) a solution of a monomer or a polymeric precursor, a solvent is then removed, and the monomer or the polymeric precursor is polymerized.

Method C: a method including a step of melting a mixture of the compound according to the embodiment of the present invention and, as components used if necessary, a binder resin and additives.

For example, a method may be used in which the compound according to the embodiment of the present invention and, as components used if necessary, additives are dispersed in a binder resin, and then the dispersion is melted.

In a case where a solvent is not used in the methods A to C and in a case where the solution is dried, the color conversion composition according to the embodiment of the present invention can be prepared as a solid mixture.

The method of mixing (dissolving, suspending, or dispersing) the compound according to the embodiment of the present invention with a solvent or a binder resin is not particularly limited. It is possible to use a stirring method, melt blending, a method of mixing the compound with a binder resin powder, and the like. As the melt blending method, known methods can be used without particular limitation, and the melt blending conditions can be set as appropriate. For example, as devices used for melt blending or dispersion and melting temperature conditions, for example, the devices and the temperature conditions described in JP2011-241160A can be used, and the descriptions thereof are preferably incorporated into the present specification.

In a case where a solvent is used, examples of the solvent include various solvents such as a hydrocarbon, a ketone compound, a halogenated hydrocarbon, an ester compound, an alcohol compound, and an ether compound, polar solvents such as N,N-dimethylformamide. N,N-dimethylacetamide, 1-methyl-2-pyrrolidone, 1,3-dimethylimidazolidinone, and dimethyl sulfoxide, water, and the like. One kind of solvent may be used singly, or a plurality of solvents may be used in combination. Specific examples of the aforementioned solvents include the organic solvents described in JP2011-241160A, and the descriptions of the solvents are preferably incorporated into the present specification.

The method of removing the solvent is not particularly limited. Usually, examples thereof include a method of evaporating and removing the solvent by leaving the solvent at room temperature or by air blowing, a method of evaporating and removing the solvent by heating, a method of evaporating and removing the solvent under reduced pressure (equal to or lower than atmospheric pressure), and a method as a combination of these.

The method of polymerizing the monomer and/or polymeric precursor in the method B is not particularly limited, and may be thermal polymerization or photopolymerization.

The thermal polymerization can be performed by a conventional method. Examples of the thermal polymerization method include a method in which a catalyst is added if necessary to a mixture of the aforementioned monomer and/or polymeric precursor and the compound according to the embodiment of the present invention, and then the mixture is heated. Regarding the thermal polymerization method, the thermal polymerization conditions, the catalyst to be used, and the amount of the catalyst to be used, for example, the method described in JP2011-241160A can be referred to, and the descriptions of the publication are preferably incorporated into the present specification.

Photopolymerization can be performed by a conventional method. Examples of the photopolymerization method include a method in which a photopolymerization initiator is added if necessary to a mixture of the aforementioned monomer and/or polymeric precursor and the compound according to the embodiment of the present invention, and then the mixture is irradiated with light. Regarding the photopolymerization method, the photopolymerization conditions, the polymerization initiator to be used, and the amount of the polymerization initiator to be used, for example, the method described in JP2011-241160A can be referred to, and the descriptions of the publication are preferably incorporated into the present specification.

In a case where the binder resin is a silicone resin, a method of polymerizing by an addition curing reaction is preferable. The addition curing reaction of the silicone resin can also be performed by a conventional method. For example, the polymerization is preferably carried out by a hydrosilylation reaction between organosiloxane having a polymerizable reactive group (for example, an alkenyl group) and hydrogen siloxane having a hydrogen atom bonded to a silicon atom. The conditions of the hydrosilylation reaction are not particularly limited, and examples thereof include a condition in which the composition is heated to a temperature equal to or higher than room temperature, for example, to 50° C. to 200° C. in the presence of an addition reaction catalyst (for example, platinum) as desired.

[Light Emitting Device]

The light emitting device according to an embodiment of the present invention has a color conversion portion consisting of the color conversion composition according to the embodiment of the present invention and a light source, and emits light of an intended wavelength. In the present invention, a unit consisting of a color conversion portion and a light source is called color conversion unit in some cases. The color conversion portion has a function of absorbing light (incoming ray) emitted (radiated) from the light source, and emitting (color conversion) light (outgoing ray) of a specific wavelength (generally, a wavelength longer than the wavelength of the incoming ray) different from the wavelength of the incoming ray. At this time, the color conversion portion totally or partially absorbs the light from the light source and radiates light of a specific wavelength. For example, in a case where the entirety of the light emitting device according to the embodiment of the present invention emits white light (a white LED, white lighting, or the like), the light emitting device can emit red light or green light by partially absorbing blue light from the light source, and the entirety of the device can emit white light with the blue light from the light source. At this time, the color conversion portion performs a function of converting light into red light or green light.

As the structure of the light emitting device according to the embodiment of the present invention, a conventionally known structure can be applied without particular limitation. Details thereof will be described later.

In the light emitting device according to the embodiment of the present invention, the way the color conversion portion and the light source are arranged is not particularly limited. The color conversion portion and the light source may be arranged close to or in contact with each other, or may be arranged in separate positions or in a state where another member is interposed therebetween. As described above, the color conversion composition and the color conversion portion according to the embodiment of the present invention exhibit excellent light fastness and excellent moisture-heat resistance. Therefore, the color conversion portion and the light source can be arranged close to or in contact with each other. In a case where the arrangement described above is adopted, the light emitting device can still emit the outgoing ray, which is obtained by the color conversion of the incoming ray, for a long period of time with a high quantum yield.

The light emitting device according to the embodiment of the present invention can be used in a white LED or as a white LED. In this case, the light emitting device still exhibits a high quantum yield, excellent light fastness, and excellent moisture-heat resistance.

<Color Conversion Portion>

The shape, dimensions, and the like of the color conversion portion are not particularly limited as long as the color conversion portion consists of the color conversion composition according to the embodiment of the present invention, and are appropriately set according to the use and the like. For example, the color conversion portion used in the light emitting device according to the embodiment of the present invention may be the color conversion composition according to the embodiment of the present invention or a molded article. In a case where the color conversion portion is the color conversion composition according to the embodiment of the present invention, generally, the color conversion portion is formed by applying (coating or disposing) the color conversion composition according to the embodiment of the present invention to a surface on which the color conversion portion is to be installed. In a case where the color conversion portion is a molded article, the shape thereof is not particularly limited. For example, the molded article may have the shape of a film, a plate (such as a sheet, a film, or a disk), a lens, fiber, an optical waveguide, or the like.

In one of the preferred embodiments, the color conversion portion has the shape of a plate. In this case, the color conversion portion (also referred to as color conversion filter) may be formed as a color conversion layer consisting of the color conversion composition according to the embodiment of the present invention. The thickness of the color conversion layer is not particularly limited, but is, for example, preferably 10 to 3,000 µm and more preferably 30 to 2,000 µm.

The color conversion portion may be a laminate (color conversion member) provided on a substrate or the like.

Examples of the substrate include a glass substrate and a resin substrate. Examples of the glass substrate include substrates made of various types of glass such as such as soda-lime glass, barium-strontium-containing glass, lead glass, aluminosilicate glass, borosilicate glass, barium-borosilicate glass, and quartz. Examples of the resin substrate include substrates made of various resins such as polycarbonate, an acrylic resin, polyethylene terephthalate, polyether sulfide, and polysulfone.

The color conversion portion may have a constituent member other than the substrate. Such a constituent member is not particularly limited as long as it is generally used for color conversion members, and examples thereof include a protective film (film) and the like.

The color conversion portion can emit outgoing ray, which is obtained by the color conversion of incoming ray, for a long period of time with a high quantum yield.

The quantum yield exhibited by the color conversion portion is preferably equal to or higher than 0.7, more preferably equal to or higher than 0.8, and even more preferably equal to or higher than 0.9. The upper limit of the quantum yield is not particularly limited, but is generally equal to or lower than 1.0. In the present invention, the quantum yield can be measured using a commercial quantum yield measuring device. For example, the quantum yield of the color conversion portion (thickness: 60 µm) can be measured using an absolute photoluminescence (PL) quantum yield measuring device: C9920-02 (manufactured by Hamamatsu Photonics K.K.).

In a case where the color conversion portion is a molded article, the color conversion portion is prepared by molding the color conversion composition according to the embodiment of the present invention in a predetermined shape.

The molding method is not particularly limited, and examples thereof include a molding method such as injection molding performed in a hot melt state and a film forming method performed after the color conversion composition according to the embodiment of the present invention is melted. The film forming method is not particularly limited, and examples thereof include a spin coating method, a roll coating method, a bar coating method, a Langmuir-Blodgett method, a casting method, a dipping method, a screen printing method, a Bubble jet (registered trademark) method, an ink jet method, a vapor deposition method, an electric field method, and the like.

In a case where the binder resin is a thermosetting or photocurable resin, it is also possible to use the method described above in which a mold is filled with a mixture of a monomer and/or a polymeric precursor of the binder resin, the compound according to the embodiment of the present invention, and the like or the mixture is formed into a film by the aforementioned film forming method, and then the mixture is polymerized by light or heat.

<Light Source>

The light source used in the light emitting device according to the embodiment of the present invention is not particularly limited as long as the light source emits light of an emission wavelength (light having a wavelength) capable of exciting at least the compound according to the embodiment of the present invention and preferably all the fluorescent compounds contained in the color conversion portion. Examples of such a light source include incandescent lamps, metal halide lamps, High Intensity Discharge (HID) lamps, xenon lamps, sodium lamps, mercury lamps, fluorescent lamps, cold cathode fluorescent lamps, cathode luminescence, low-speed electronic beam tubes, light emitting diodes [for example, GaP (red and green), $GaP_xAs_{(1-x)}$ (red, orange, and yellow: $0<x<1$), $Al_xGa_{(1-x)}As$ (red: $0<x<1$), GaAs (red), SiC (blue). GaN (blue), ZnS, and ZnSe], electroluminescence (for example, an inorganic EL or an organic EL using a ZnS matrix and an emission center), lasers (for example, a He—Ne laser, a $CO_2$ laser, an Ar, Kr, He—Cd laser, an excimer laser, a gas laser such as a nitrogen laser, a ruby laser, an yttrium-aluminum-garnet (YAG) laser, a solid state laser such as a glass laser, a dye laser, and a semiconductor laser), sunlight, and the like.

The light source is preferably a light emitting diode, electroluminescence, or a semiconductor laser, and more preferably a light emitting diode.

As the light emitting diode, a semiconductor light emitting element is preferable which has a light emitting layer capable of emitting light of an emission wavelength that can excite at least the compound according to the embodiment of the present invention. Examples of such a semiconductor light emitting element include semiconductor light emitting elements having a light emitting layer containing the semiconductor described above. As a semiconductor other than the semiconductors described above, a nitride semiconductor ($In_xAl_yGa_{(1-x-y)}$, $0 \leq X$, $0 \leq Y$, $X+Y \leq 1$) is preferable which can emit light of a short wavelength capable of efficiently exciting the compound according to the embodiment of the present invention. More preferably, the light emitting layer does not contain the compound according to the embodiment of the present invention. The semiconductor contained in the light emitting layer is preferably an inorganic semiconductor. Examples of the structure of the semiconductor include a homo-structure having a Metal-Insulator-Silicon (MIS) junction, a PIN junction, a pn junction, or the like, a hetero structure, and a double heterostructure. Various emission wavelengths can be selected according to the material of the light emitting layer or the degree of mixing of crystals in the light emitting layer. Furthermore, it is possible to adopt a single quantum well structure or a multiple quantum well structure obtained by forming the light emitting layer as a thin film that brings about a quantum effect.

In a case where the light emitting device according to the embodiment of the present invention is caused to emit white light as will be described later, considering the complementary color relationship with the emission wavelength from the compound according to the embodiment of the present invention or the deterioration of the binder resin, the emission wavelength (excitation wavelength) of the light source is preferably 350 to 480 nm. In order to further improve the excitation and emission efficiency of the light source and the compound according to the embodiment of the present invention, the emission wavelength is more preferably 380 to 450 nm. The light emitting diode is usually disposed on a substrate such as copper foil having a patterned metal. Herein, examples of the material of the substrate include an organic or inorganic compound (for example, glass and ceramics) having insulating properties. As the organic compound, various polymer materials (for example, an epoxy resin and an acrylic resin) can be used. The shape of the substrate is not particularly limited, and can be selected from various shapes such as a plate shape, a cup shape, and a porous plate shape.

The semiconductor laser described above is not particularly limited, but preferably has the following mechanism. That is, a pn junction is formed in a semiconductor, a forward bias is applied thereto, and minority carriers at a high energy level are injected into the semiconductor such that the electrons flowing into the p region are recombined with holes and the holes flowing into the n region are recombined with electrons. As a result, electrons are moved to a low energy level from a high energy level, and photons equivalent to the energy difference are released. This is an example of the mechanism of the semiconductor laser described above.

Examples of the material of the semiconductor laser include group IV elements such as germanium and silicon, direct transition-type group III-V and group II-VI compounds such as GaAs and InP that do not result in lattice vibration, and the like. Furthermore, not only binary materials but also multi-element materials such as ternary, quaternary, and quinary materials may be used as these materials. In addition, the semiconductor laser may have a laminated structure such as a double heterostructure provided with a clad layer, or may be constituted with a lower clad, an active layer, and an upper clad. Moreover, a multiple quantum well structure may also be applied.

The light emitting device according to the embodiment of the present invention may comprise a color filter if desired. In a case where the light emitting device has a color filter, the color purity can be adjusted. The color filter is not particularly limited as long as it is a commonly used color filter. Examples of pigments used for the color filter include various pigments such as perylene pigments, lake pigments, azo pigments, quinacridone pigments, anthraquinone pigments, anthracene pigments, isoindoline pigments, isoindolinone pigments, phthalocyanine pigments, basic triphenylmethane dyes, indanthrone pigments, indophenol pigments, cyanine pigments, and dioxazine pigments, a pigment mixture of two or more kinds of pigments among these, and a mixture of the pigment or pigment mixture described above and a binder resin (solid-state mixture in which the pigment or the pigment mixture and the binder resin are dissolved or dispersed).

In the light emitting device according to the embodiment of the present invention, the compound according to the embodiment of the present invention can convert an incoming ray from a light source and preferably an incoming ray in the wavelength range described above into an outgoing ray of a predetermined wavelength with a high quantum yield, and emit the outgoing ray for a long period of time. The quantum yield is as described above.

The light emitted by the entirety of the light emitting device according to the embodiment of the present invention may be only the light having undergone color conversion by the compound or color conversion portion according to the embodiment of the present invention, or may be light mixed with the light of the aforementioned wavelength emitted from a light source.

<Constitution of Light Emitting Device>

The constitution of the light emitting device according to the embodiment of the present invention is not particularly limited, and examples thereof include the following constitutions.

Specifically, examples of the constitution thereof include light source/color conversion portion, light source/light transmitting substrate/color conversion portion, light source/color conversion portion/light transmitting substrate, light source/light transmitting substrate/color conversion portion/light transmitting substrate, light source/color conversion portion/color filter, light source/light transmitting substrate/color conversion portion/color filter, light source/color conversion portion/light transmitting substrate/color filter, light source/light transmitting substrate/color conversion portion/light transmitting substrate/color filter, light source/light transmitting substrate/color conversion portion/color filter/light transmitting substrate, and light source/color conversion portion/color filter/light transmitting substrate. In each of the above constitutions, the color conversion portion consists the color conversion composition according to the embodiment of the present invention. In addition, the light emitting device may have another color conversion portion performing color conversion to generate light different from the light converted by the color conversion portion described above. In this case, there is no particular limitation on the arrangement relationship between the color conversion portion consisting of the color conversion composition according to the embodiment of the present invention and another color conversion portion. For example, the color conversion portions may be arranged in a line. In each of the above constitutions, the respective constituents are arranged in contact with or separated from each other.

The light transmitting substrate refers to a substrate that can transmit 50% or more of visible light. Specifically, the light transmitting substrate has the same definition as the substrate that the color conversion portion may have. The color filter has the same definition as the color filter that the color conversion portion may have. The shape of the light transmitting substrate and the color filter is not particularly limited, and the light transmitting substrate and the color filter may have the shape of a plate or lens.

The light emitting device according to the embodiment of the present invention can be used for various purposes. For example, the light emitting device can be preferably used in display devices such as various displays, lighting devices, and the like.

The display devices are not particularly limited, and examples thereof include various (liquid crystal) displays, liquid crystal backlights, liquid crystal front lights, liquid crystal display devices such as field-sequential liquid crystal displays, traffic signals, traffic display devices, and the like. The lighting devices are not particularly limited, and examples thereof include general lighting devices (instruments), local lighting devices, lighting devices for interior decoration, and the like.

The light emitting device according to the embodiment of the present invention can be prepared by known methods. For example, the light emitting device can be prepared by sequentially laminating the constituents used in the constitution described above or by bonding the constituents to each other. There is no particular limitation on the order in which the constituents are laminated.

EXAMPLES

Hereinafter, the present invention will be more specifically described based on the following examples, but the present invention is not limited thereto.

Compounds (1) to (12) and comparative compounds (1) and (2) used in examples and comparative examples will be shown below. In the following compounds, Me represents methyl.

Compound (1)

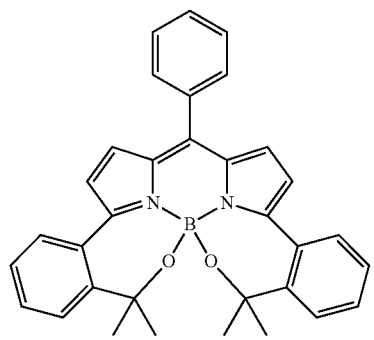

Compound (2)

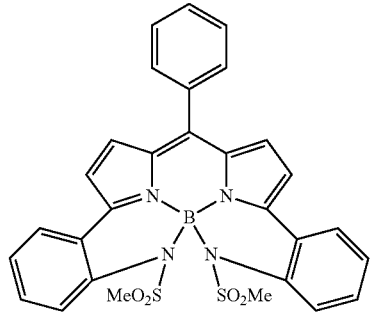

Compound (3)

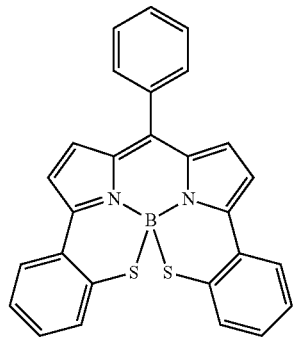

Compound (4)

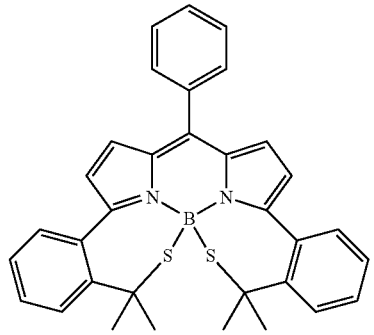

Compound (5)

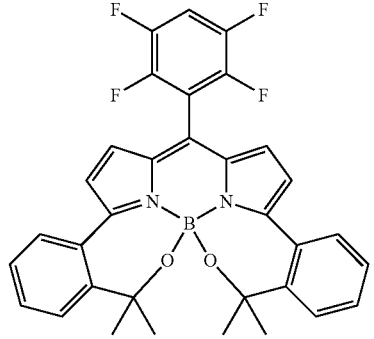

Compound (6)
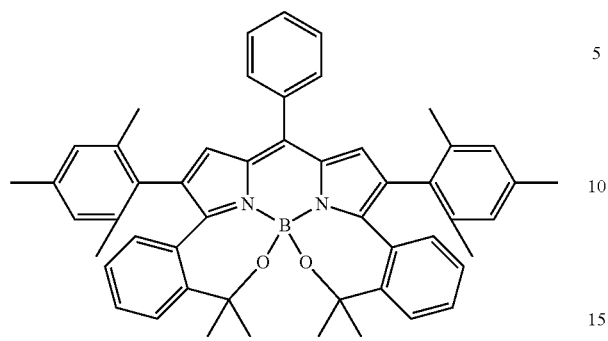
Compound (7)
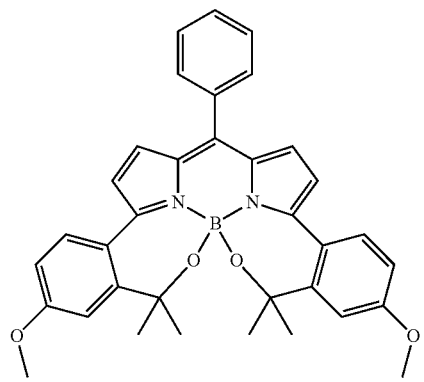
Compound (8)
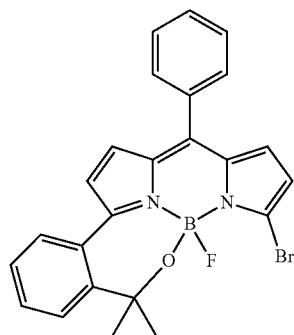
Comparative compound (1)
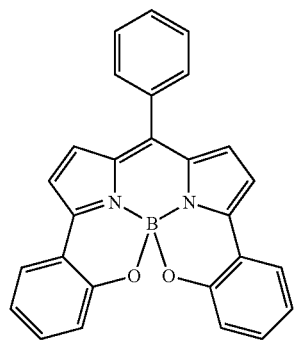
Comparative compound (2)
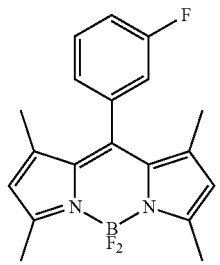
Compound (9)
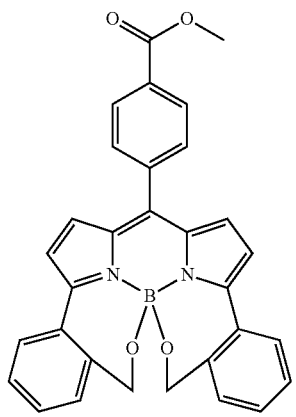
Compound (10)
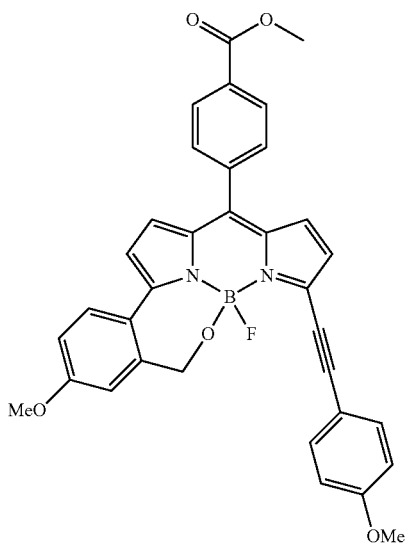

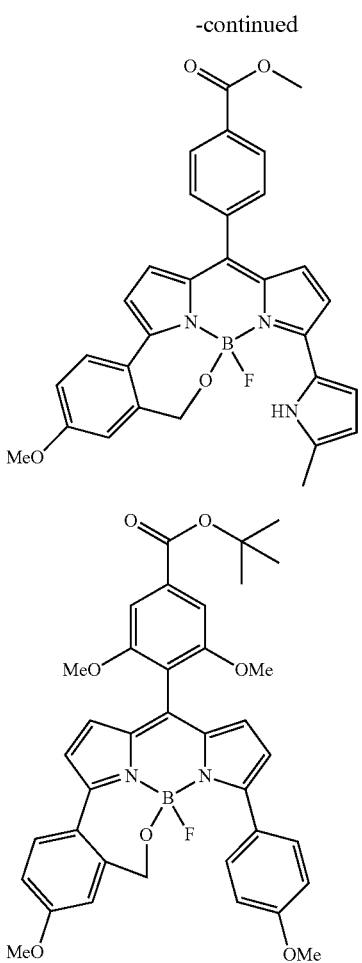

Compound (11)

Compound (12)

The comparative compound (1) is the compound A described in paragraph "0052" of WO2013/035303A.

The comparative compound (2) is the compound described in the second section from the right of the second column in paragraph "0143" of WO2016-190283A.

Hereinafter, the method for synthesizing the compounds (1) to (12) used in examples will be specifically described, but the starting material, the dye intermediate, and the synthesis route are not limited thereto.

In the present invention, room temperature means 25° C.

Abbreviations used in the synthesis of each compound shown below represent the following compounds or groups.
Me: methyl
Et: ethyl
NBS: N-bromosuccinimide
THF: tetrahydrofuran
DDQ: 2,3-dichloro-5,6-dicyano-p-benzoquinone
DIPEA: N,N-diisopropylethylamine
CPME: methoxycyclopentane
PdCl$_2$ (dtbpf): [1,1'-bis (di-tert-butylphosphino)ferrocene] palladium (II) dichloride
Bu: butyl
TEA: triethylamine
SPhos Pd G3: (2-Dicyclohexylphosphino-2',6'-dimethoxybiphenyl) [2-(2'-amino-1,1'-biphenyl)] palladium (II) methanesulfonate
DMAP: N,N-dimethyl-4-aminopyridine
IPrEtN: N,N-diisopropylethylamine
TBuOH: t-butanol (Boc)$_2$O: di-tert-butyl dicarbonate
DMF: N,N-dimethylformamide
TFA: trifluoroacetic acid Synthesis Example 1: Synthesis of Compound (1)

The compound (1) was synthesized based on the following scheme.

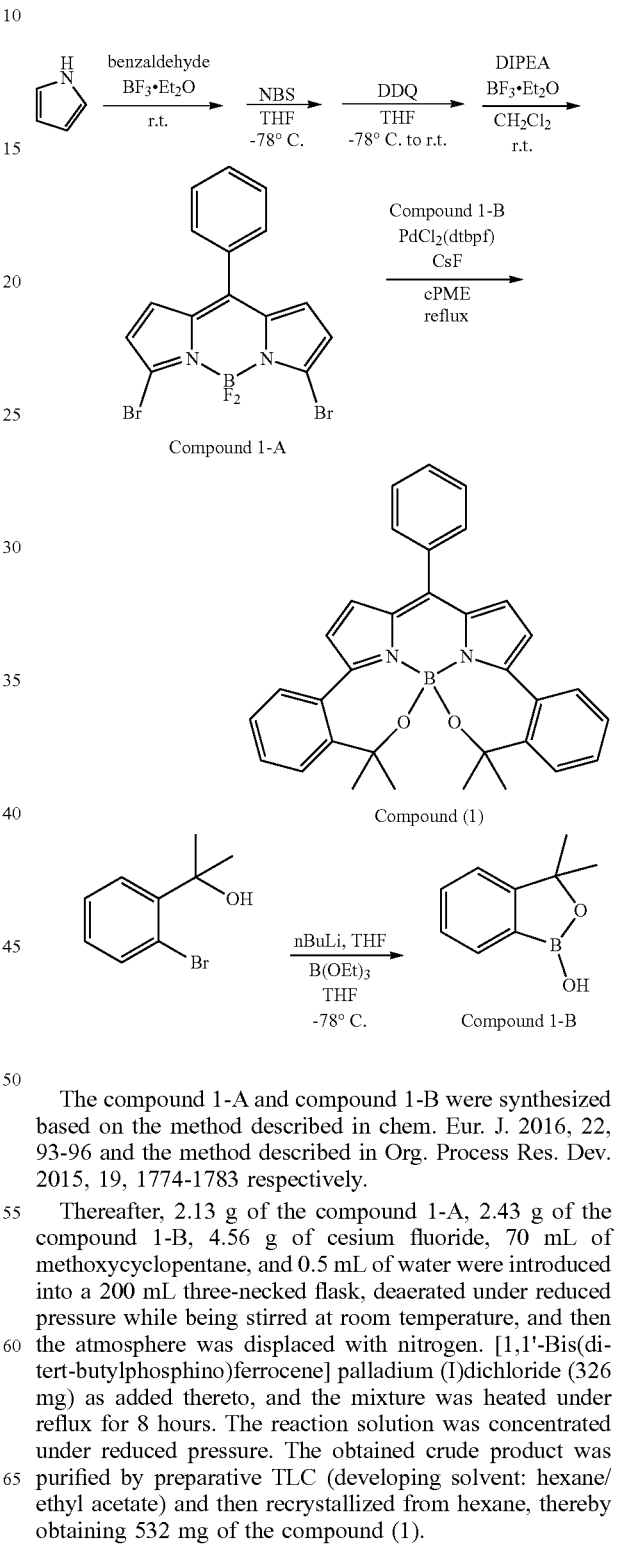

The compound 1-A and compound 1-B were synthesized based on the method described in chem. Eur. J. 2016, 22, 93-96 and the method described in Org. Process Res. Dev. 2015, 19, 1774-1783 respectively.

Thereafter, 2.13 g of the compound 1-A, 2.43 g of the compound 1-B, 4.56 g of cesium fluoride, 70 mL of methoxycyclopentane, and 0.5 mL of water were introduced into a 200 mL three-necked flask, deaerated under reduced pressure while being stirred at room temperature, and then the atmosphere was displaced with nitrogen. [1,1'-Bis(di-tert-butylphosphino)ferrocene] palladium (I)dichloride (326 mg) as added thereto, and the mixture was heated under reflux for 8 hours. The reaction solution was concentrated under reduced pressure. The obtained crude product was purified by preparative TLC (developing solvent: hexane/ethyl acetate) and then recrystallized from hexane, thereby obtaining 532 mg of the compound (1).

The compound (1) was identified by ESI-MS and ¹H-NMR (solvent: deuterated dichloromethane).

ESI-MS: [M+H]⁺=497.

$^1$H-NMR (CD$_2$Cl$_2$, 400 MHz): δ 7.71 to 7.65 (m, 2H), 7.61 to 7.54 (m, 5H), 7.52 to 7.46 (m, 2H), 7.40-7.31 (m, 4H), 6.98 (d, J=4.28, 2H), 6.74 (d, J=4.28, 2H), 1.17 (s, 6H), 0.94 (s, 6H)

Synthesis Example 2: Synthesis of Compound (2)

The compound (2) was synthesized based on the following scheme.

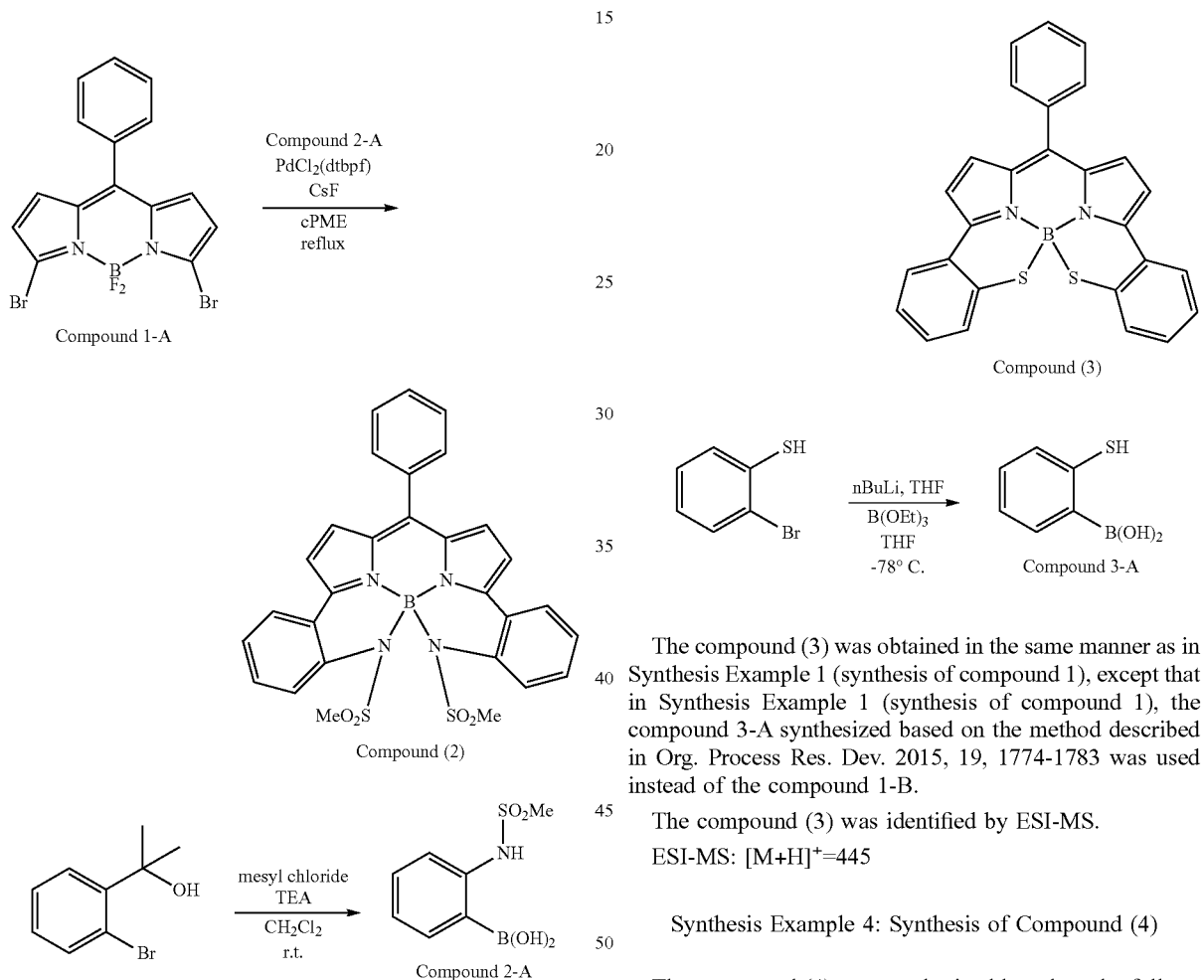

The compound (2) was obtained in the same manner as in Synthesis Example 1 (synthesis of compound 1), except that in Synthesis Example 1 (synthesis of compound 1), the compound 2-A synthesized based on the method described in US2005/192310B was used instead of the compound 1-B.

The compound (2) was identified by ESI-MS.

ESI-MS: [M+H]⁺=567

Synthesis Example 3: Synthesis of Compound (3)

The compound (3) was synthesized based on the following scheme.

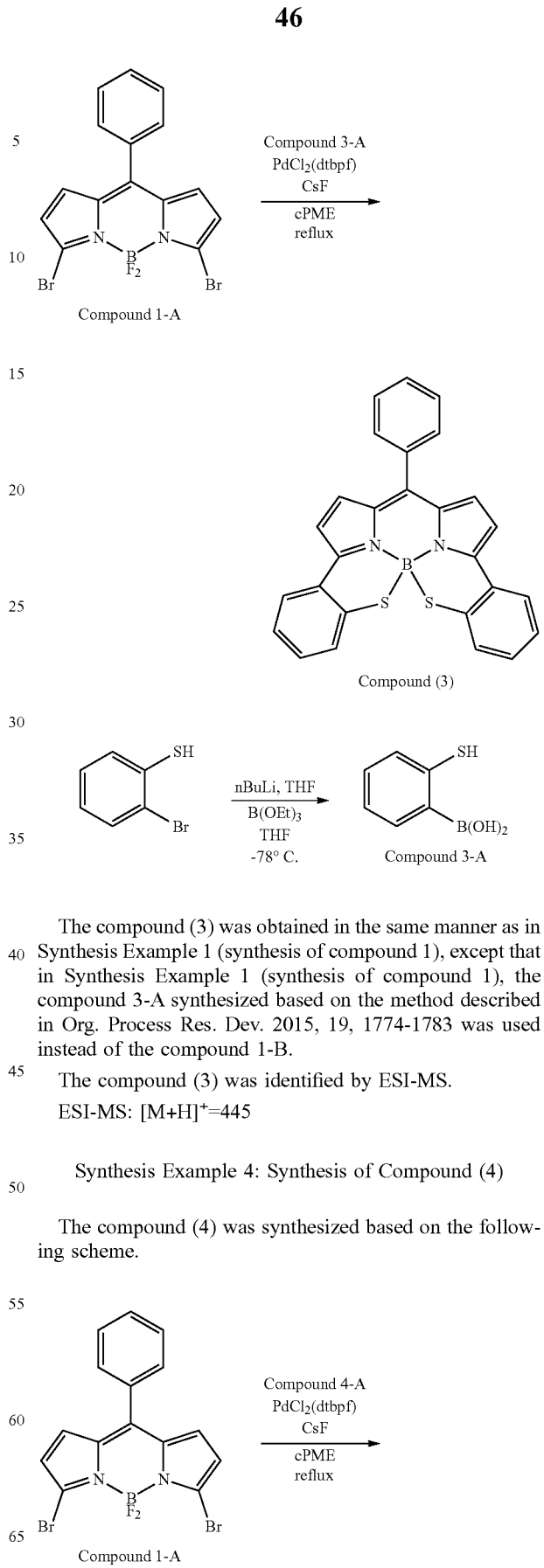

The compound (3) was obtained in the same manner as in Synthesis Example 1 (synthesis of compound 1), except that in Synthesis Example 1 (synthesis of compound 1), the compound 3-A synthesized based on the method described in Org. Process Res. Dev. 2015, 19, 1774-1783 was used instead of the compound 1-B.

The compound (3) was identified by ESI-MS.

ESI-MS: [M+H]⁺=445

Synthesis Example 4: Synthesis of Compound (4)

The compound (4) was synthesized based on the following scheme.

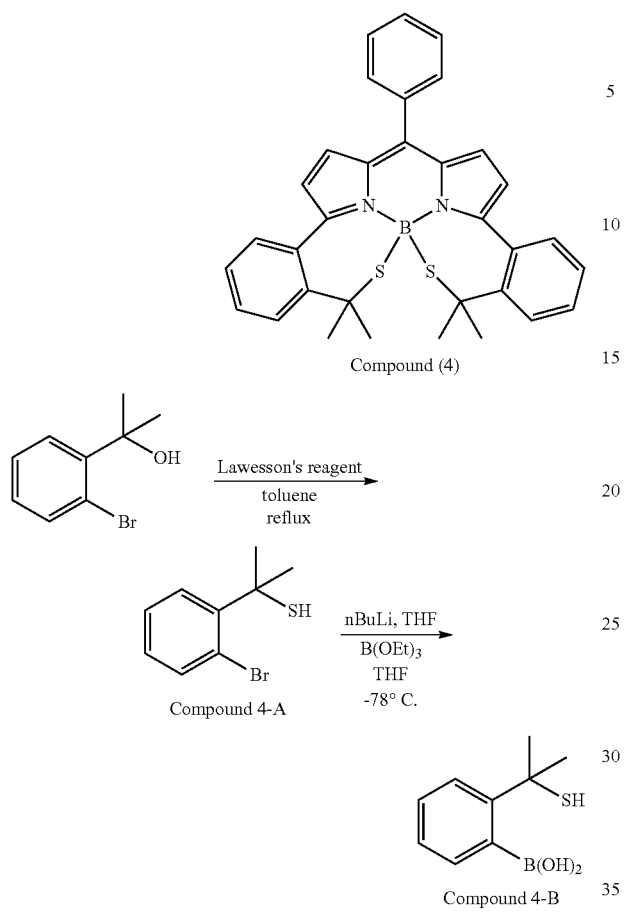

The compound (4) was obtained in the same manner as in Synthesis Example 1 (synthesis of compound 1), except that in Synthesis Example 1 (synthesis of compound 1), the compound 4-B was used instead of the compound 1-B.

The compound 4-B was synthesized based on the method described in Org. Process Res. Dev. 2015, 19, 1774-1783 by using the compound 4-A synthesized based on the method described in J. Am. Chem. Soc. 2017, 139, 6484-6493.

The compound (4) was identified by ESI-MS.

ESI-MS: [M+H]$^+$=529

Synthesis Example 5: Synthesis of Compound (5)

The compound (5) was synthesized based on the following scheme.

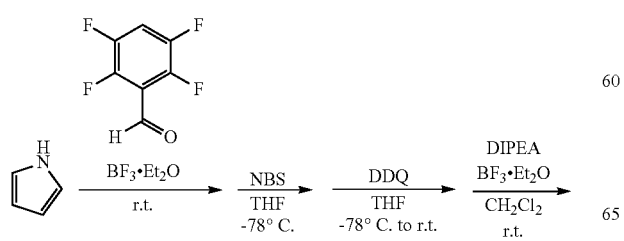

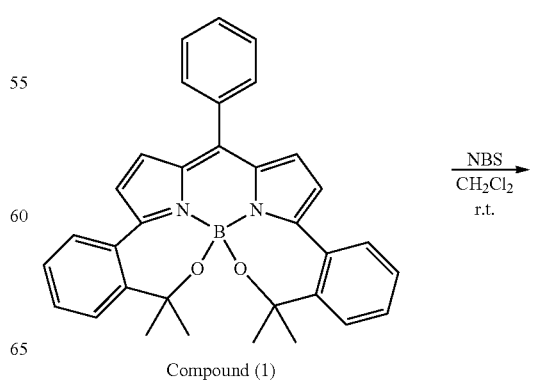

The compound (5) was obtained in the same manner as in Synthesis Example 1 (synthesis of compound 1), except that in Synthesis Example 1 (synthesis of compound 1), the compound 5-A synthesized based on the method described in chem. Eur. J. 2016, 22, 93-96 was used instead of the compound 1-A.

The compound (5) was identified by ESI-MS and $^1$H-NMR (solvent: deuterated dichloromethane).

ESI-MS: [M+H]$^+$=569.

$^1$H-NMR (CD$_2$Cl$_2$, 400 MHz): δ7.53-7.51 (m, 2H), 7.44-7.40 (m, 2H), 7.39-7.22 (m, 5H), 6.77 (d, J=4.4, 2H), 6.68 (d, J=4.4, 2H), 1.10 (s, 6H), 0.88 (s, 6H)

Synthesis Example 6: Synthesis of Compound (6)

The compound (6) was synthesized based on the following scheme.

-continued

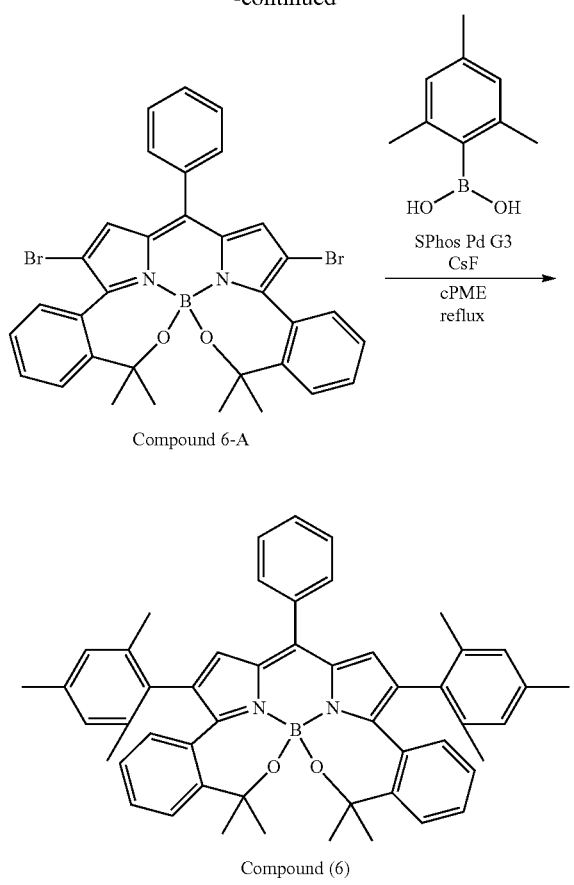

The compound (1) (100 mg) and 10 mL of dichloromethane were introduced into a 100 mL three-necked flask, and stirred at room temperature. Then, 86 mg of N-bromosuccinimide was introduced into the flask, and the mixture was stirred at room temperature for 1 hour.

The obtained reaction solution was concentrated under reduced pressure, and then 10 mL of an aqueous sodium thiosulfate solution (containing about 2 g of sodium thiosulfate dissolved) and 20 ml of methylene chloride were added thereto, followed by extraction and liquid separation. The obtained organic layer was pre-dried over anhydrous sodium sulfate, and then concentrated under reduced pressure. By recrystallizing the obtained crude product from methanol, 103 mg of a compound 6-A was obtained.

Thereafter, 100 mg of the compound 6-A, 201 mg of 2,4,6-trimethylphenyl borate, 230 mg of cesium fluoride, and 20 mL of methoxycyclopentane were introduced into a 100 mL three-necked flask, deaerated under reduced pressure while being stirred at room temperature, and then the atmosphere was displaced with nitrogen. SPhos Pd G3 (96 mg, manufactured by Sigma-Aldrich Co. LLC.) was added thereto, and the mixture was heated under reflux for 1 hour. A saturated aqueous solution of ammonium chloride (20 mL) and 20 ml of ethyl acetate were added to the obtained reaction solution, followed by extraction and liquid separation. The obtained organic layer was pre-dried over anhydrous sodium sulfate, and then concentrated under reduced pressure. The obtained crude product was purified by silica gel column chromatography (developing solvent: hexane/ethyl acetate) and then recrystallized from methanol, thereby obtaining 58 mg of the compound (6).

The compound (6) was identified by ESI-MS.
ESI-MS: $[M+H]^+ = 733$

Synthesis Example 7: Synthesis of Compound (7)

The compound (7) was synthesized based on the following scheme.

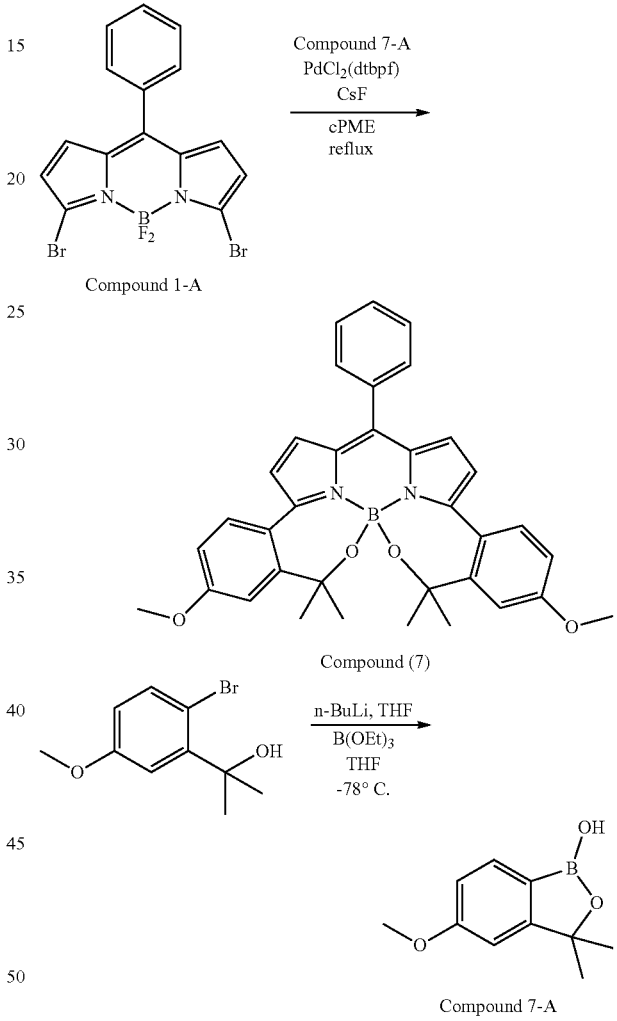

The compound (7) was obtained in the same manner as in Synthesis Example 1 (synthesis of compound 1), except that in Synthesis Example 1 (synthesis of compound 1), the compound 7-A synthesized based on the method described in Org. Process Res. Dev. 2015, 19, 1774-1783 was used instead of the compound 1-B.

The compound (7) was identified by ESI-MS.
ESI-MS: $[M+H]^+ = 557$

Synthesis Example 8: Synthesis of Compound (8)

The compound (8) was synthesized based on the following scheme.

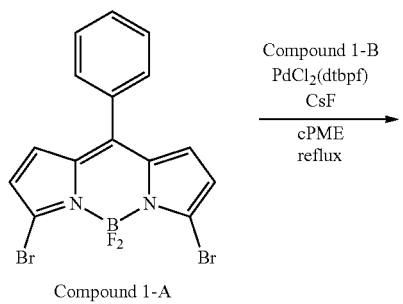

Compound 1-A

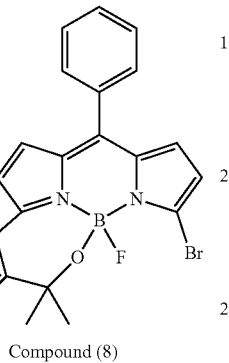

Compound (8)

The compound (8) was obtained in the same manner as in Synthesis Example 1 (synthesis of compound 1), except that in Synthesis Example 1 (synthesis of compound 1), the amount of the compound 1-B used was changed to 1.2 g.

The compound (8) was identified by ESI-MS.

ESI-MS: $[M+H]^+=461$

Synthesis Example 9: Synthesis of Compound (9)

The compound (9) was synthesized based on the following scheme.

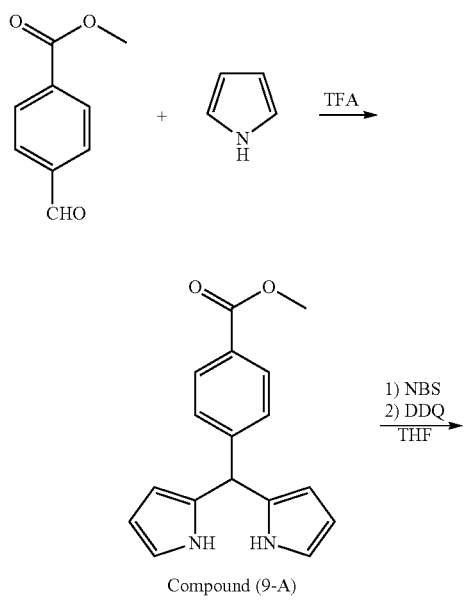

Compound (9-A)

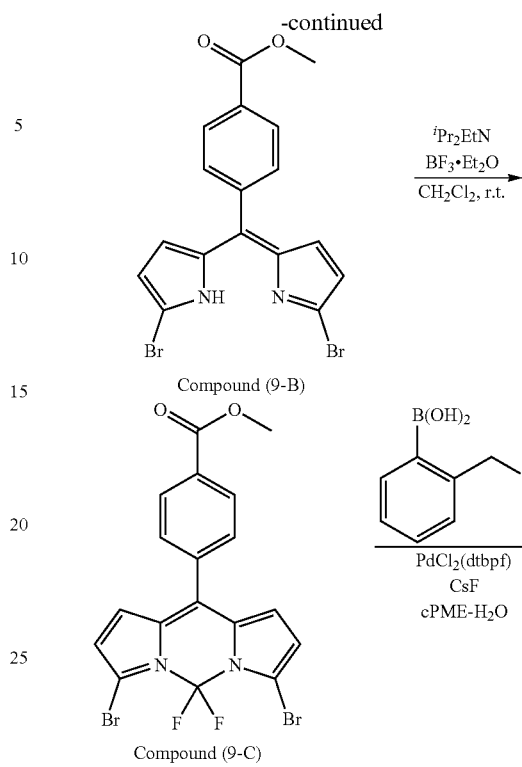

Compound (9-B)

Compound (9-C)

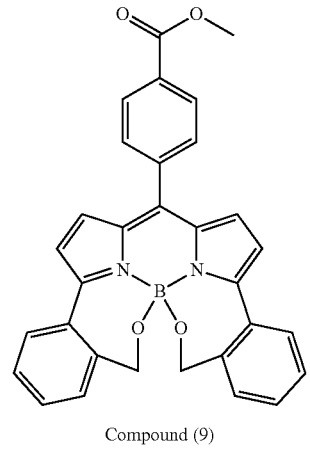

Compound (9)

Methyl p-formylbenzoate (5 g) and 36 g of pyrrole were put in a 300 mL three-necked flask and purged with nitrogen. The internal temperature was adjusted to 10° C. in an ice bath, and 0.115 mL of trifluoroacetic acid was added dropwise thereto with stirring. Then, the mixture was returned to room temperature and stirred for 2 hours. The reaction solution was purified by silica gel column chromatography (eluent: ethyl acetate/hexane=0/100→50/50 gradient), and 60 mL of hexane and 3 mL of isopropanol were added to the purified product, followed by stirring. The precipitate was separated by filtration, washed with hexane, and then dried, thereby obtaining 4.7 g of a compound (9-A).

The compound (9-A)(4.7 g) and 80 mL of tetrahydrofuran were added to a 500 mL three-necked flask, and cooled to a temperature equal to or lower than −60° C. in an acetone dry ice bath while being stirred under nitrogen. A solution prepared by dissolving 6.3 g of N-bromosuccinimide in 60 mL of tetrahydrofuran was added dropwise thereto and allowed to react for 45 minutes. Then, a solution prepared by dissolving 4.19 g of 2,3-dichloro-5,6-dicyano-p-benzoquinone in 60 mL of tetrahydrofuran was added dropwise thereto and allowed to react for 70 minutes. Thereafter, tetrahydrofuran was distilled away by being concentrated using a rotary evaporator, thereby obtaining a crude product. The crude product was dissolved in dichloromethane and purified by silica gel column chromatography using ethyl acetate/hexane=0/100 to 40/60 as an eluent, thereby obtaining 4.0 g of a compound (9-B).

The compound (9-B) (4.0 g) and 100 mL of dichloromethane were added to a 500 mL three-necked flask, and cooled to 0° C. in a salted ice bath while being stirred under nitrogen. N,N-diisopropylethylamine (5.6 mL) was added thereto, and 10 minutes later, 6.3 mL of a boron trifluoride-diethyl ether complex was added thereto and allowed to react for 30 minutes at 0° C. Thereafter, 100 mL of a saturated aqueous solution of sodium hydrogen carbonate was added dropwise thereto, and the mixture was stirred. The organic phase was extracted and concentrated using a rotary evaporator. The concentrate was dissolved in the minimum amount of dichloromethane, and purified by silica gel column chromatography using ethyl acetate/hexane=0/100 to 100/0 as an eluent. The purified product was dissolved in the minimum amount of dichloromethane, methanol was added thereto, dichloromethane was distilled away under reduced pressure by using a rotary evaporator, and the precipitate was filtered. The residue was washed with methanol and dried, thereby obtaining 3.0 g of a compound (9-C).

The compound (9-C) (1.73 g), 239 mL of cPME, 0.4 mL of water, 3.26 g of cesium fluoride, and 1.82 g of o-(hydroxymethyl) phenylborate were added to a 500 mL three-necked flask, and subjected to deaeration and nitrogen purging with stirring. Thereafter, 300 mg of PdCl$_2$ (dtbpf) was added thereto, and the mixture was stirred at an external temperature of 120° C. for 1 hour. The mixture was left to cool, then filtered through celite, and subjected to liquid separation using ethyl acetate/distilled water. The organic phase was concentrated under reduced pressure, and purified by silica gel column chromatography using ethyl acetate/hexane=0/100→100/0 as an eluent, thereby obtaining 0.15 g of the compound (9).

The compound (9) was identified by ESI-MS.
ESI-MS: [M+H]$^+$=499

Synthesis Example 10: Synthesis of Compound (10)

The compound (10) was synthesized based on the following scheme.

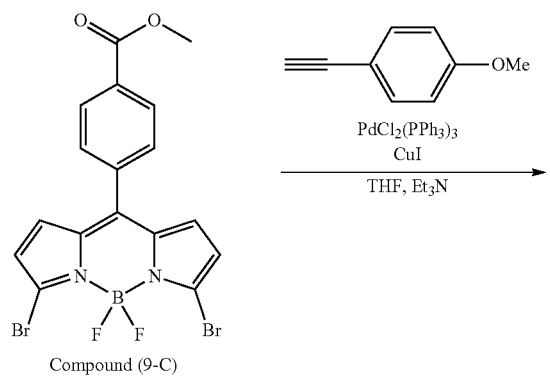

Compound (9-C)

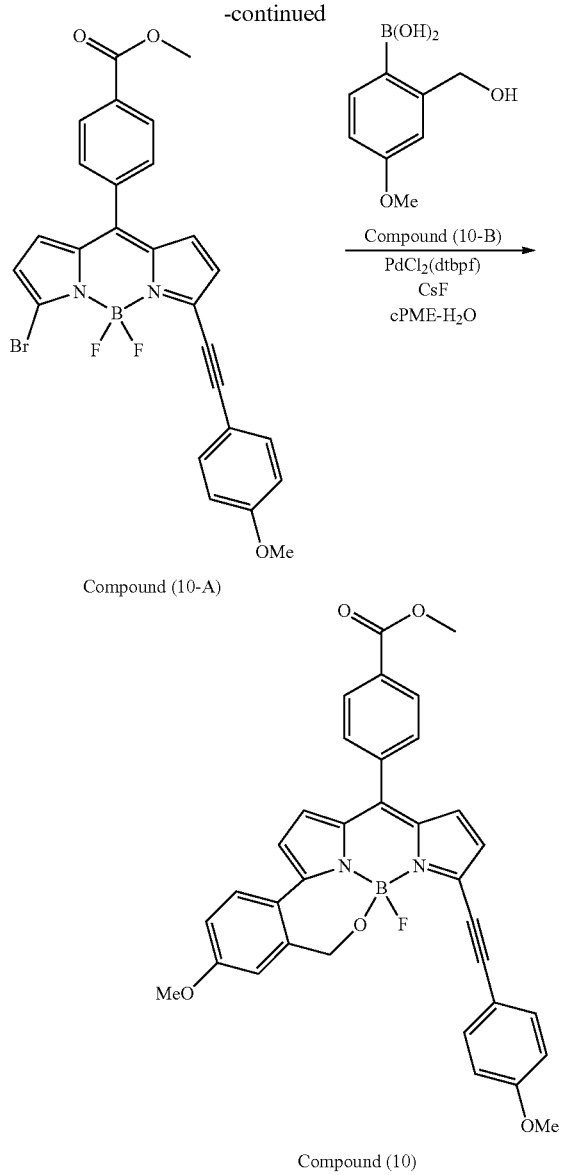

Compound (10-A)

Compound (10)

The compound (9-C) (0.5 g), 25 mL of THF, 2 mL of triethylamine, 0.137 g of ethynylanisole, 7 mg of copper iodide, and 11 mg of bis(triphenylphosphine) palladium (11) were put in a 100 mL three-necked flask, subjected to nitrogen purging, and allowed to react for 1 hour at an external temperature of 75° C. After the reaction, the solvent was distilled away, and the residue was purified by silica gel column chromatography using ethyl acetate/hexane=0/100→50/50 as an eluent, thereby obtaining 0.40 g of a compound (10-A).

The compound (10) was synthesized by the same method as the synthesis method of the compound (9), except that in the synthesis method of the compound (9), the compound (10-A) was used instead of the compound (9-C).

The compound (10) was identified by ESI-MS.
ESI-MS: [M-F]$^+$=553

Synthesis Example 11: Synthesis of Compound (11)

The compound (11) was synthesized based on the following scheme.

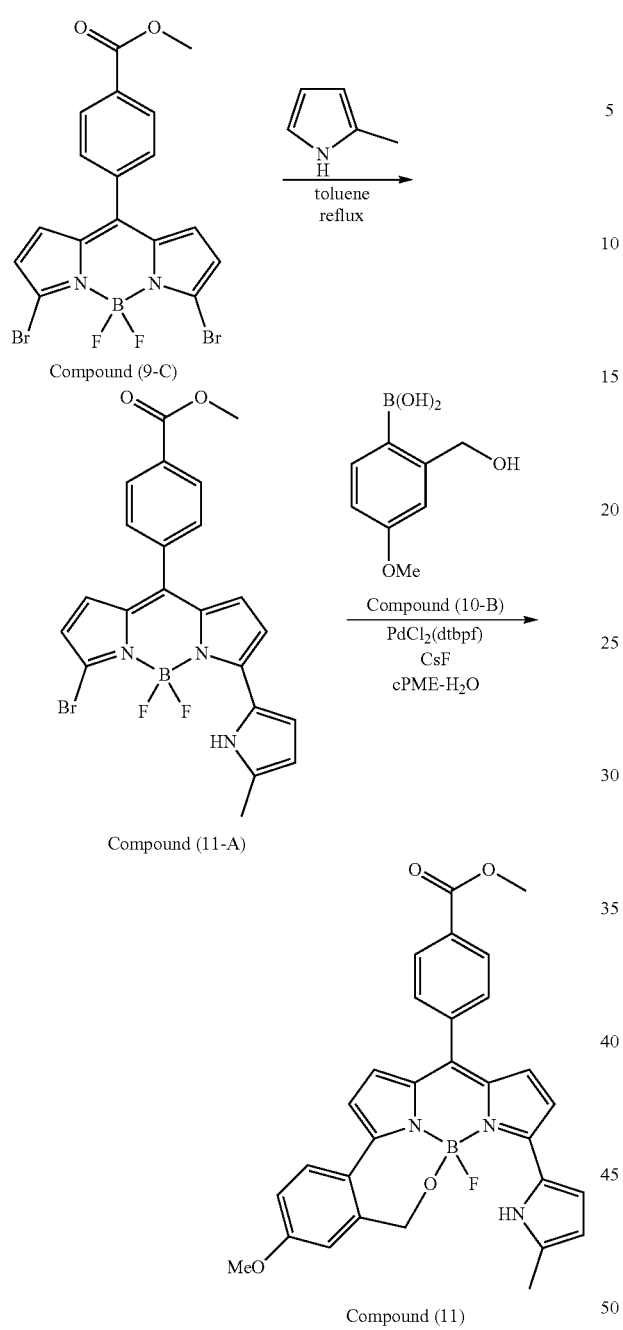

Synthesis Example 12: Synthesis of Compound (12)

The compound (12) was synthesized based on the following scheme.

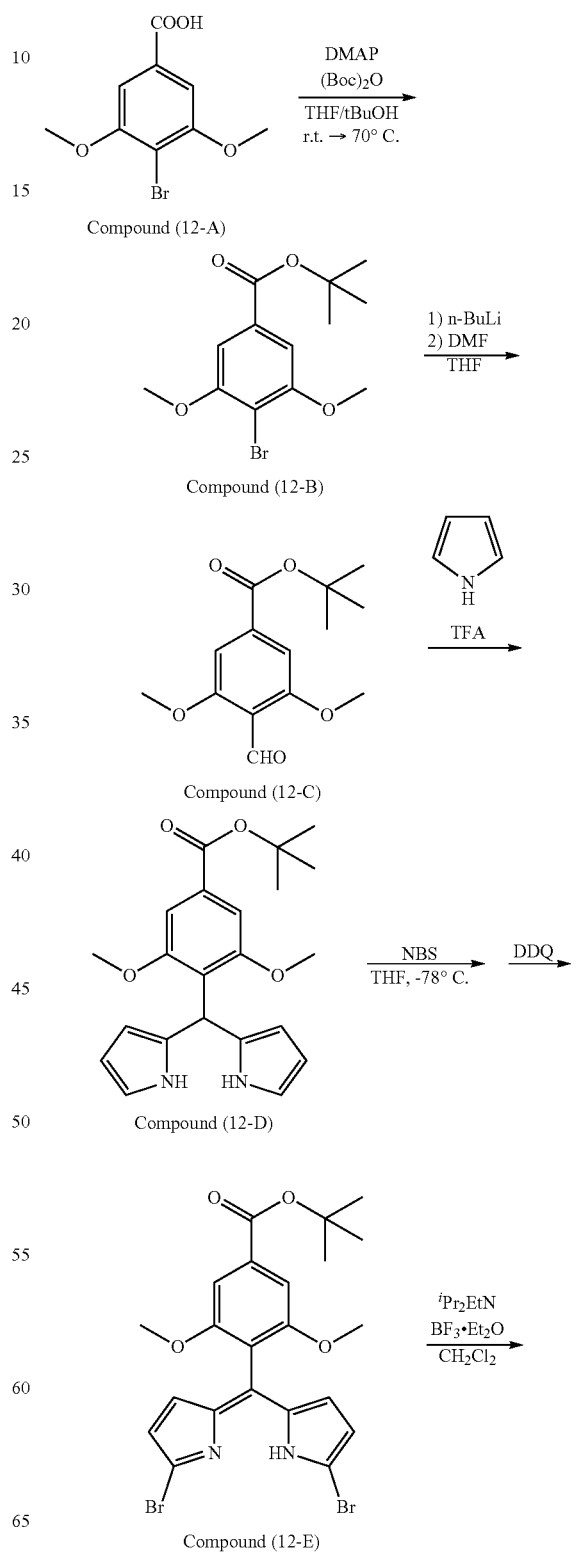

The compound (9-C) (0.5 g), 0.126 g of 2-methyl-1H-pyrrole, and 5 mL of toluene were put in a 100 mL three-necked flask, subjected to nitrogen purging, and then allowed to react for 2.5 hours at an external temperature of 130° C. The reaction solution was returned to room temperature and purified by silica gel column chromatography using ethyl acetate/hexane=0/100→50/50 as an eluent, thereby obtaining 0.30 g of a compound (11-A).

The compound (11) was synthesized by the same method as the synthesis method of the compound (10), except that in the synthesis method of the compound (10), the compound (11-A) was used instead of the compound (10-A).

The compound (11) was identified by ESI-MS.

ESI-MS: [M-F]$^+$=502

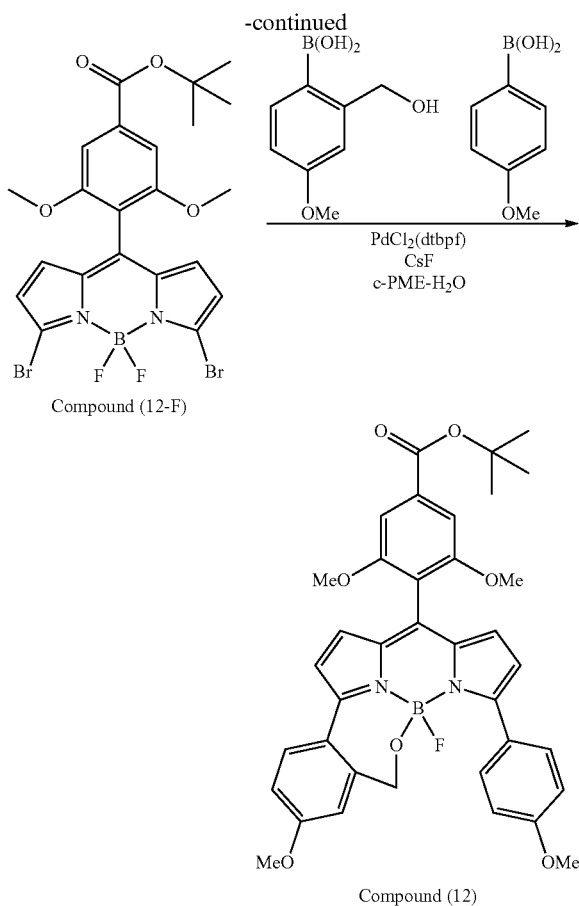

Compound (12-F)

Compound (12)

A 1 L three-necked flask was purged with nitrogen, and 25 g of a compound (12-A), 17.55 g of DMAP, 125 mL of THF (super-dehydrated, containing a stabilizer) and 125 mL of t-butanol were added to the flask, and in a state where the mixture was being stirred at room temperature, 41.3 g of di-tert-butyl dicarbonate was added dropwise thereto. After being stirred for 4 hours, the mixture was left to stand overnight, then heated to 70° C., and stirred and heated for 1 hour. The reaction solution was returned to room temperature and concentrated under reduced pressure so as to distill away the solvent, 188 mL of ethanol and 15.4 g of imidazole were added thereto, and the mixture was stirred for 3 hours. Thereafter, the solvent was distilled away under reduced pressure, 200 mL of hexane and 265 mL of ethyl acetate were added thereto, and the mixture was stirred for 20 minutes at room temperature. The precipitate was separated by filtration and washed with 240 mL of a mixed solvent of ethyl acetate/hexane=1/2, thereby obtaining 50 g of a crude product. The crude product was dissolved in 50 mL of dichloromethane, 95 mL of hexane was added thereto, and the mixture was purified by silica gel column chromatography using ethyl acetate/hexane=0/100→5/95→15/85 as an eluent, thereby obtaining 18.2 g of a compound (12-B).

A 1 L three-necked flask was purged with nitrogen, 18.23 g of the compound (12-B) and 414 mL of THF (super-dehydrated, containing a stabilizer) were put in the flask, and the mixture was stirred and cooled to a temperature equal to or lower than −60° C. by using a dry ice-acetone bath. n-Butyllithium (36 mL) was slowly added dropwise thereto and allowed to react for 30 minutes, and 9 mL of DMF (super-dehydrated) was slowly added dropwise thereto. The mixture was stirred for 10 minutes, then heated to 0° C. to 10° C., and stirred for 2 hour. A saturated aqueous solution of ammonium chloride (200 mL) was added dropwise to the reaction solution, the reaction solution was stirred for 30 minutes, and then 10 mL of 30% aqueous hydrochloric acid was added dropwise thereto. The obtained liquid was moved to a 1 L separatory funnel, and a small amount of ethyl acetate and a 25% aqueous sodium chloride solution were added thereto for liquid separation. Then, magnesium sulfate was added to the organic phase for drying, followed by natural filtration. The solvent of the filtrate was distilled away under reduced pressure, thereby obtaining 19.11 g of a crude product. A solution was prepared by adding 30 mL of dichloromethane and 30 mL of hexane to the crude product, and the solution was purified by silica gel column chromatography using ethyl acetate/hexane=0/100→10/90→20/80 as an eluent, thereby obtaining 12.25 g of a compound (12-C).

The compound (12) was synthesized by the same method as the synthesis method of the compound (9), except that in the synthesis method of the compound (9), the compound (12-C) was used instead of methyl p-formylbenzoate, and the compound (10-13) and 4-methoxyphenyl borate (compound (10-B)/4-methoxyphenyl borate=1/1) were used instead of o-(hydroxymethyl)phenyl borate.

The compound (12) was identified by ESI-MS.
ESI-MS: [M-F]$^+$=632

Example 1

Polystyrene (30 g, PSJ-polystyrene SGP-10, manufactured by PS Japan Corporation.) was dissolved in 70 g of methylene chloride, then 7.5 mg (0.5 μmol/g) of the compound (1) was added thereto, thereby preparing a color conversion composition (solution).

Then, a glass plate was spin-coated with the color conversion composition by 2,000 rotations, and dried on a hot plate at 100° C., thereby preparing a film-shaped color conversion member. The thickness of the obtained color conversion layer was 60 μm.

Examples 2 and 3

Color conversion compositions (solutions) and film-shaped color conversion members were prepared in the same manner as in Example 1, except that in preparing the color conversion composition (solution) of Example 1, the amount of the compound (1) added was changed to the value shown in Table 1. The thickness of the obtained color conversion layer was 60 μm.

Example 4

Cellulose acylate having an acetyl substitution degree of 2.87 was prepared. As a catalyst, sulfuric acid (7.8 parts by mass with respect to 100 parts by mass of cellulose) was added to the cellulose acylate. Furthermore, carboxylic acid as a raw material of an acyl substituent was added thereto, and an acylation reaction was performed at 40° C. After the acylation, the product was left to age at 40° C. Furthermore, the cellulose acylate was washed with acetone so as to remove low molecular weight components.

Thereafter, 30 g of the cellulose acylate was dissolved in 170 g of a mixed solvent of methylene chloride-methanol (mass ratio 87:13), and then 7.5 mg (0.5 μmol/g) of the compound (1) was added thereto, thereby preparing a color conversion composition (solution).

Subsequently, a glass plate was spin-coated with the color conversion composition by 2,000 rotations, and dried on a hot plate at 140° C., thereby preparing a film-shaped color conversion member. The thickness of the obtained color conversion layer was 60 μm.

Example 5

Polymethyl methacrylate (30 g, manufactured by Sigma-Aldrich Co. LLC.) was dissolved in 300 m L of toluene, 7.5 mg (0.5 μmol/g) of the compound (1) was then added thereto, thereby preparing a color conversion composition (solution).

Then, a glass plate was spin-coated with the color conversion composition by 2,000 rotations, and dried on a hot plate at 50° C., thereby preparing a film-shaped color conversion member. The thickness of the obtained color conversion layer was 60 μm.

Example 6

A solution A (15 g) and 15 g of a solution B of a silicone resin (KER-2500, dual component addition curing type, manufactured by Shin-Etsu Chemical Co., Ltd.) were mixed together, and then 7.5 mg (0.5 μmol/g) of the compound (1) was added thereto. These are mixed together using a rotation/revolution mixer (AWATORI RENTARO manufactured by THINKY CORPORATION) at 2,000 rpm (rotation per minute) and defoamed at 2,200 rpm. In this way, a color conversion composition (solution) was prepared.

Thereafter, a glass plate was coated with the color conversion composition and heated on a hot plate for 2 hours at 60° C. and then for 4 hours at 150° C. so as to cure the composition. In this way, a film-shaped color conversion member was prepared. The thickness of the obtained color conversion layer was 60 μm.

Example 7

The compound (1) (2.5 mg) was diluted by being dissolved in 50 mL of N-methylpyrrolidone-N-(2-hydroxyethyl)piperazine-N'-2-ethanesulfonic acid (NMP-HEPES) buffer (pH 7.2) (volume ratio=1:1) such that the absorbance thereof measured using a UV3150 spectrophotometer (manufactured by Shimadzu Corporation) became 1.0, thereby preparing a color conversion composition (solution).

Examples 8 to 18 and Comparative Examples 1 and 3

Color conversion compositions (solutions) and film-shaped color conversion members were prepared in the same manner as in Example 1, except that in preparing the color conversion composition (solution) of Example 1, the compounds shown in Table 1 were used instead of the compound (1). The thickness of the obtained color conversion layer was 60 μm.

Comparative Examples 2 and 4

Color conversion compositions (solutions) were prepared in the same manner as in Example 7, except that in preparing the color conversion composition (solution) of Example 7, the compounds shown in Table 1 were used instead of the compound (1).

[Evaluation of Color Conversion Composition or Film-Shaped Color Conversion Member]

For the prepared color conversion compositions and film-shaped color conversion members, the following characteristics were evaluated. The results are shown in Table 1.

<Measurement of Quantum Yield>

Each of the prepared film-shaped color conversion members was cut in a size of 15 mm×15 mm, thereby obtaining a test piece (with a glass plate). The quantum yield of the test piece was measured using an absolute PL quantum yield measuring device C9920-02 (manufactured by Hamamatsu Photonics K.K.). The excitation wavelength was set to a wavelength 50 nm shorter than the maximum absorption wavelength of the compound used for each of the color conversion members.

In which of the following evaluation ranks the measured quantum yield is was determined.

For Example 7 and Comparative Examples 2 and 4, the quantum yield was measured in a state where the prepared color conversion composition (solution) was put in a quartz cell (quantum yield in a solution state).

In this test, the quantum yield that is in the evaluation rank B or a higher rank is regarded as acceptable.

—Evaluation Rank—

AA: equal to or higher than 0.9
A: equal to or higher than 0.8 and less than 0.9
B: equal to or higher than 0.7 and less than 0.8
C: equal to or higher than 0.6 and less than 0.7
D: equal to or higher than 0.5 and less than 0.6
E: less than 0.5

<Light Fastness Test>

Each of the prepared film-shaped color conversion members was cut in a size of 40 mm×40 mm, thereby preparing a test piece. The test piece was irradiated with light for a predetermined time by using a xenon irradiator UXL-500D-O (output 500 W, 170,000 lux, manufactured by Ushio Inc.). Then, by using a UV3150 spectrophotometer (manufactured by Shimadzu Corporation), the absorbance thereof was measured, and the light fastness thereof was evaluated. For evaluating the light fastness, absorbance retention after irradiation for 200 hours: rate of change in absorbance before and after irradiation at maximum absorption wavelength (absorbance after irradiation at maximum absorption wavelength/absorbance before irradiation at maximum absorption wavelength) was calculated, and in which the following evaluation ranks the obtained rate of change is was determined. The test condition is as follows.

For Example 7 and Comparative Examples 2 and 4, the light fastness was evaluated in a state where the prepared color conversion composition (solution) was put in a quartz cell (light fastness in a solution state).

In this test, the light fastness that is in the evaluation rank B or a higher rank is regarded as acceptable.

—Test Condition—

Irradiation time: 200 hours
Filter used for irradiation: sharp cut filter L38 (manufactured by HOYA CORPORATION)

—Evaluation Rank—

AA: equal to or higher than 90%
A: equal to or higher than 80% and less than 90%
B: equal to or higher than 70% and less than 80%
C: equal to or higher than 60% and less than 70%
D: equal to or higher than 50% and less than 60%
E: less than 50%

<Moisture-Heat Resistance Test>

Each of the prepared film-shaped color conversion members was cut in a size of 40 mm×40 mm, thereby preparing a test piece. The test piece was stored in a thermohygrostat (ESPEC CORP PR-4T, manufactured by ESPEC CORP.). After the storage for a predetermined time, the absorbance was measured using a UV3150 spectrophotometer, and the moisture-heat resistance was evaluated. For evaluating the moisture-heat resistance, absorbance retention rate after lapse of 7 days: rate of change in absorbance before and after storage at maximum absorption wavelength (absorbance after storage at maximum absorption wavelength/absorbance before storage at maximum absorption wavelength) was calculated, and in which of the following evaluation ranks the obtained rate of change is was determined. The test condition is as follows.

For Example 7 and Comparative Examples 2 and 4, moisture-heat resistance was not evaluated (described as "-" in Table 1).

In this test, the light fastness that is in the evaluation rank C or a higher rank is regarded as acceptable.

prepared color conversion composition (solution) was put in a quartz cell (emission spectrum in a solution state).

The color conversion performance was determined based on in which of the following wavelength ranges the maximum wavelength of the emission spectrum is. In a case where the maximum absorption wavelength is within the following range, each of the color conversion composition and the color conversion member is regarded as being capable of converting the incoming ray into a wavelength (color) in the following wavelength range.

—Wavelength Range of Maximum Wavelength—

AA: equal to or longer than 600 nm and less than 700 nm
A: equal to or longer than 580 nm and less than 600 nm
B: equal to or longer than 560 nm and less than 580 nm
C: equal to or longer than 540 nm and less than 560 nm
D: equal to or longer than 520 nm and less than 540 nm
E: equal to or longer than 480 nm and less than 520 nm

TABLE 1

| | Compound | Amount of addition (μmol/g) | Content (part by mass) | Resin | Content of resin (% by mass) | Quantum yield | Light fastness | Moisture-heat resistance | Color conversion performance |
|---|---|---|---|---|---|---|---|---|---|
| Comparative Example 1 | Comparative Compound (1) | 0.5 | 0.020 | Polystyrene | 99.98 | D | D | E | A |
| Comparative Example 2 | Comparative Compound (1) | — | — | N/A | — | C | E | — | A |
| Comparative Example 3 | Comparative Compound (2) | 0.5 | 0.017 | Polystyrene | 99.98 | D | E | D | D |
| Comparative Example 4 | Comparative Compound (2) | — | — | N/A | — | C | E | — | E |
| Example 1 | Compound (1) | 0.5 | 0.025 | Polystyrene | 99.97 | AA | AA | AA | A |
| Example 2 | Compound (1) | 0.1 | 0.005 | Polystyrene | 99.99 | AA | AA | AA | A |
| Example 3 | Compound (1) | 1.0 | 0.05 | Poly-styrene | 99.95 | A | AA | AA | A |
| Example 4 | Compound (1) | 0.5 | 0.025 | Cellulose acrylate | 99.97 | A | AA | A | A |
| Example 5 | Compound (1) | 0.5 | 0.025 | Methacrylic resin | 99.97 | AA | AA | AA | A |
| Example 6 | Compound (1) | 0.5 | 0.025 | Silicone resin | 99.97 | AA | AA | AA | A |
| Example 7 | Compound (1) | — | — | N/A | — | AA | AA | — | A |
| Example 8 | Compound (2) | 0.5 | 0.028 | Polystyrene | 99.97 | B | B | B | C |
| Example 9 | Compound (3) | 0.5 | 0.022 | Polystyrene | 99.98 | B | B | C | A |
| Example 10 | Compound (4) | 0.5 | 0.026 | Polystyrene | 99.97 | A | B | AA | A |
| Example 11 | Compound (5) | 0.5 | 0.028 | Polystyrene | 99.97 | AA | AA | AA | AA |
| Example 12 | Compound (6) | 0.5 | 0.037 | Polystyrene | 99.96 | AA | AA | AA | AA |
| Example 13 | Compound (7) | 0.5 | 0.028 | Polystyrene | 99.97 | AA | AA | A | A |
| Example 14 | Compound (8) | 0.5 | 0.023 | Polystyrene | 99.98 | B | A | A | C |
| Example 15 | Compound (9) | 0.5 | 0.025 | Polystyrene | 99.97 | B | AA | AA | A |
| Example 16 | Compound (10) | 0.5 | 0.029 | Polystyrene | 99.97 | B | B | A | AA |
| Example 17 | Compound (11) | 0.5 | 0.026 | Polystyrene | 99.97 | B | B | A | AA |
| Example 18 | Compound (12) | 0.5 | 0.032 | Polystyrene | 99.97 | B | B | B | AA |

In Table 1, "Content (part by mass)" represents the content of a compound with respect to 100 parts by mass of a resin.

—Test Condition—
Storage time: 7 days
Set temperature: 85° C.
Set humidity: 85 RH %
—Evaluation Rank—
AA: equal to or higher than 90%
A: equal to or higher than 80% and less than 90%
B: equal to or higher than 70% and less than 80%
C: equal to or higher than 60% and less than 70%
D: equal to or higher than 50% and less than 60%
E: less than 50%

<Evaluation of Color Conversion Performance>

Each of the prepared film-shaped color conversion members was cut in a size of 15 mm×15 mm, thereby preparing a test piece. The emission spectrum of the test piece was measured using a fluorescence spectrometer RF5300PC (manufactured by Shimadzu Corporation).

For Example 7 and Comparative Examples 2 and 4, the emission spectrum was measured in a state where the The results in Table 1 tell the following.

All of the color conversion compositions or color conversion members of comparative examples, which do not contain the compound represented by General Formula (I) or General Formula (II) specified in the present invention as a phosphor, have a low quantum yield and fails to achieve both the high level of light fastness and high level of moisture-heat resistance.

In contrast, all of the color conversion compositions or color conversion members, which contain the compound represented by General Formula (I) or General Formula (II) specified in the present invention as a phosphor, have been found to exhibit an excellent color conversion function. That is, even though the color conversion compositions and the color conversion members of examples are in the form of a solution composition or in the form of a film-shaped color conversion member (solid composition) as a mixture with a binder resin, the color conversion compositions and the color conversion members exhibit a high quantum yield and can achieve both the high level of light fastness and high level of moisture-heat resistance.

Manufacture and Evaluation of Liquid Crystal Display Device

Example 19

A dye filter was removed from a backlight unit of a commercial liquid crystal television (JS7000FXZA, manufactured by SAMSUNG), and instead, the film-shaped color conversion member (with a glass plate) prepared in Example 11 was inserted between a prism sheet and a diffusion plate.

As a light source of the liquid crystal television: JS7000FXZA, a white LED obtained by combining a blue LED with a green phosphor and a red phosphor was used.

The obtained liquid crystal television was evaluated in terms of the color reproduction range and luminance by the apparatus. As a result, it has been confirmed that in the liquid crystal television using the color conversion member prepared in Example 11, the color reproduction range and luminance are further improved than in a liquid crystal television (JS7000FXZA comprising a dye filter originally installed in the television).

This result shows that the display device comprising the color conversion member according to an embodiment of the present invention has a high quantum yield, excellent light fastness, and excellent moisture-heat resistance, and can emit an outgoing ray, which is obtained by the color conversion of an incoming ray, for a long period of time with a high quantum yield.

The present invention has been described together with the embodiments thereof. The inventors of the present invention consider that unless otherwise specified, the present invention is not limited to any of the details of the description of the invention, and should be broadly interpreted without being against the gist and scope of the invention shown in the attached claims.

The present application claims a priority based on Japanese Patent Application No. 2018-018985 filed in Japan on Feb. 6, 2018, the content of which is incorporated into the present specification as a part of the description of the present specification.

What is claimed is:

1. A color conversion composition comprising: at least one kind of compound between a compound represented by General Formula (I) or a compound represented by General Formula (II),

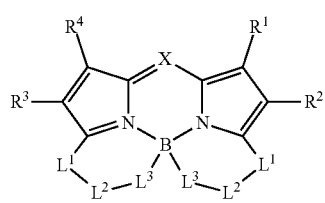

General Formula (I)

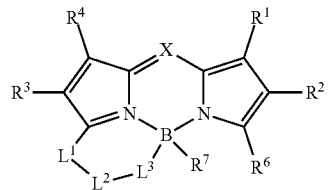

General Formula (II)

in the general formulas, X represents $CR^5$ or N, $R^1$ to $R^6$ represent a hydrogen atom, an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, a halogen atom, a cyano group, a formyl group, an R—CO— group, an R—O—CO— group, an R—CO—O— group, an $(R^A)_2$N—CO— group, an amino group, a nitro group, or a silyl group, R represents an alkyl group, a cycloalkyl group, an aliphatic heterocyclic group, an alkenyl group, a cycloalkenyl group, an alkynyl group, an aryl group, or a heteroaryl group, $R^A$ represents a hydrogen atom, an alkyl group, a cycloalkyl group, an aliphatic heterocyclic group, an alkenyl group, a cycloalkenyl group, an alkynyl group, an aryl group, or a heteroaryl group, $R^7$ represents an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, or a halogen atom, $R^6$ and $R^7$ are not bonded to each other to form a ring, $L^1$ represents a linking group selected from an arylene group, a heteroarylene group, an ethenylene group, an alkylene group, and a cycloalkylene group, $L^2$ represents a single bond, a carbonyl group, or an alkylene group which forms a ring structure together with $L^1$ and $L^3$ and has 1 to 6 carbon atoms, in a case where $L^3$ is a linking group represented by Formula (1-1), $L^2$ represents the carbonyl group or the alkylene group having 1 to 6 carbon atoms, $L^3$ represents a linking group represented by any of the Formulas (1-1) to (1-3),

Formula (1-1)

Formula (1-2)

Formula (1-3)

in Formula (1-3), $R^{11}$ represents a hydrogen atom or a substituent, and

* represents a portion bonded to a boron atom or $L^2$ in General Formula (I) or General Formula (II).

2. The color conversion composition according to claim 1, wherein all of $L^3$s represent the linking group represented by Formula (1-1).

3. The color conversion composition according to claim 1, wherein X represents $CR^5$, and $R^5$ is an aryl group.

4. The color conversion composition according to claim 1, wherein all of $L^2$s represent an alkylene group which forms a ring structure together with $L^1$ and $L^3$ and has 1 carbon atom.

5. The color conversion composition according to claim 1, wherein all of ring structures formed of adjacent carbon and nitrogen atoms in a pyrrole ring, a boron atom, and $L^1$ to $L^3$ in the compounds represented by the general formulas are 6-membered or 7-membered ring structures.

6. The color conversion composition according to claim 1, further comprising:
a resin.

7. The color conversion composition according to claim 6, wherein the resin is polystyrene, a (meth)acrylic resin, a silicone resin, or a mixture of two or more kinds of these.

8. The color conversion composition according to claim 1, wherein a content of the compound in the color conversion composition is 0.1 to 0.5 μmol/g.

9. A light emitting device, comprising:
a light source; and
a color conversion portion which converts light emitted from the light source and consists of the color conversion composition according to claim 1.

10. The light emitting device according to claim 9, which is a display device or a lighting device.

11. The light emitting device according to claim 10, wherein the display device is a liquid crystal display device.

12. A compound represented by General Formula (I),

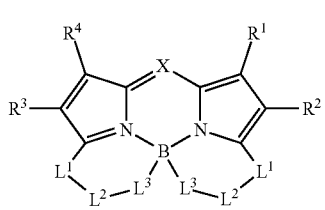

General Formula (I)

in the general formula, X represents $CR^5$ or N,
$R^1$ to $R^5$ represent a hydrogen atom, an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, a halogen atom, a cyano group, a formyl group, an R—CO— group, an R—O—CO— group, an R—CO—O— group, an $(R^A)_2$N—CO— group, an amino group, a nitro group, or a silyl group, R represents an alkyl group, a cycloalkyl group, an aliphatic heterocyclic group, an alkenyl group, a cycloalkenyl group, an alkynyl group, an aryl group, or a heteroaryl group, $R^A$ represents a hydrogen atom, an alkyl group, a cycloalkyl group, an aliphatic heterocyclic group, an alkenyl group, a cycloalkenyl group, an alkynyl group, an aryl group, or a heteroaryl group,
$L^1$ represents a linking group selected from an arylene group, a heteroarylene group, an ethenylene group, an alkylene group, and a cycloalkylene group, $L^2$ represents a single bond, a carbonyl group, or an alkylene group which forms a ring structure together with $L^1$ and $L^3$ and has 1 to 6 carbon atoms, in a case where $L^3$ is a linking group represented by Formula (1-1), $L^2$ represents the carbonyl group or the alkylene group having 1 to 6 carbon atoms,
$L^3$ represents a linking group represented by any of Formulas (1-1) to (1-3),

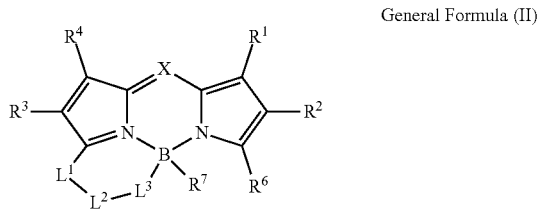

in Formula (1-3), $R^{11}$ represents a hydrogen atom or a substituent, and
* represents a portion bonded to a boron atom or $L^2$ in General Formula (I).

13. A compound represented by General Formula (II),

General Formula (II)

in the general formula, X represents $CR^5$ or N,
$R^1$ to $R^6$ represent a hydrogen atom, an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, a halogen atom, a cyano group, a formyl group, an R—CO— group, an R—O—CO— group, an R—CO—O— group, an $(R^A)_2$N—CO— group, an amino group, a nitro group, or a silyl group, R represents an alkyl group, a cycloalkyl group, an aliphatic heterocyclic group, an alkenyl group, a cycloalkenyl group, an alkynyl group, an aryl group, or a heteroaryl group, $R^A$ represents a hydrogen atom, an alkyl group, a cycloalkyl group, an aliphatic heterocyclic group, an alkenyl group, a cycloalkenyl group, an alkynyl group, an aryl group, or a heteroaryl group,
$R^7$ represents an alkyl group, a cycloalkyl group, an aliphatic heterocyclic group, an alkenyl group, a cycloalkenyl group, an alkynyl group, a hydroxyl group, a mercapto group, an alkoxy group, an alkylthio group, an aryloxy group, an arylthio group, an aryl group, a heteroaryl group, or a halogen atom,
$R^6$ and $R^7$ are not bonded to each other to form a ring,
$L^1$ represents a linking group selected from an arylene group, a heteroarylene group, an ethenylene group, an alkylene group, and a cycloalkylene group,
$L^2$ represents a single bond, a carbonyl group, or an alkylene group which forms a ring structure together with $L^1$ and $L^3$ and has 1 to 6 carbon atoms, in a case where $L^3$ is a linking group represented by Formula (1-1), $L^2$ represents the carbonyl group or the alkylene group having 1 to 6 carbon atoms, $L^3$ represents a linking group represented by any of Formulas (1-1) to (1-3),

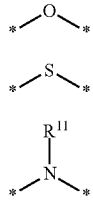

Formula (1-1)

Formula (1-2)

Formula (1-3)

in Formula (1-3), $R^{11}$ represents a hydrogen atom or a substituent, and

\* represents a portion bonded to a boron atom or $L^2$ in General Formula (II).

\* \* \* \* \*